United States Patent
Hirosawa

(10) Patent No.: US 9,773,993 B2
(45) Date of Patent: Sep. 26, 2017

(54) ELECTROLUMINESCENCE ELEMENT

(71) Applicant: Konica Minolta, Inc., Tokyo (JP)

(72) Inventor: Shota Hirosawa, Hino (JP)

(73) Assignee: KONICA MINOLTA, INC., Tokyo (JP)

(*) Notice: Subject to any disclaimer, the term of this patent is extended or adjusted under 35 U.S.C. 154(b) by 0 days.

(21) Appl. No.: 15/110,857

(22) PCT Filed: Dec. 2, 2014

(86) PCT No.: PCT/JP2014/081886
§ 371 (c)(1),
(2) Date: Jul. 11, 2016

(87) PCT Pub. No.: WO2015/107790
PCT Pub. Date: Jul. 23, 2015

(65) Prior Publication Data
US 2016/0336526 A1    Nov. 17, 2016

(30) Foreign Application Priority Data

Jan. 16, 2014 (JP) ................. 2014-006177

(51) Int. Cl.
| H01L 51/50 | (2006.01) |
| B82Y 20/00 | (2011.01) |
| H05B 33/14 | (2006.01) |
| B82Y 30/00 | (2011.01) |

(52) U.S. Cl.
CPC ............ *H01L 51/502* (2013.01); *B82Y 20/00* (2013.01); *H05B 33/14* (2013.01); *B82Y 30/00* (2013.01)

(58) Field of Classification Search
None
See application file for complete search history.

(56) References Cited

U.S. PATENT DOCUMENTS

2015/0287927 A1* 10/2015 Okubo ................. B82Y 20/00
257/40

FOREIGN PATENT DOCUMENTS

| JP | 2009099544 A | 5/2009 |
| JP | 2012169460 A | 9/2012 |
| JP | 2014078380 A | 5/2014 |
| JP | 2014078381 A | 5/2014 |

(Continued)

OTHER PUBLICATIONS

International Search Report dated Feb. 10, 2015 for PCT/JP2014/081886.

*Primary Examiner* — Whitney T Moore
(74) *Attorney, Agent, or Firm* — Lucas & Mercanti, LLP

(57) ABSTRACT

Disclosed herein is an electroluminescence element that is excellent in color rendering properties and has a long service life as a white light-emitting element, that is, high durability. The electroluminescence element (100) includes: a substrate (1); a first electrode (2); a functional layer (20) including at least one light-emitting layer (5); and a second electrode (8), wherein the at least one light-emitting layer (5) contains a quantum dot material (11), and wherein when a particle size at a cumulative frequency of 10% and a particle size at a cumulative frequency of 90% in a volume-based cumulative particle size distribution of the quantum dot material (11) are defined as d10 (nm) and d90 (nm), respectively, the quantum dot material (11) satisfies d90−d10≥3 nm.

11 Claims, 2 Drawing Sheets

(56) References Cited

FOREIGN PATENT DOCUMENTS

WO      2008013069 A1    1/2008
WO      2013157494 A1   10/2013

* cited by examiner

ELECTROLUMINESCENCE ELEMENT

CROSS REFERENCE TO RELATED APPLICATION

This Application is a 371 of PCT/JP2014/081886 filed on Dec. 2, 2014 which, in turn, claimed the priority of Japanese Application No. 2014-006177 filed on Jan. 16, 2014, both applications are incorporated herein by reference.

TECHNICAL FIELD

The present invention relates to an electroluminescence element.

BACKGROUND ART

Among electroluminescence elements, an organic electroluminescence element (hereinafter, sometimes referred to as "organic EL element") using an organic substance has recently been regarded as a promising element as a solid luminescence-type inexpensive large-area full-color display element or a writing light source array, and therefore has been actively researched and developed.

An organic EL element is a thin film-type all-solid element including a film, a pair of positive and negative electrodes formed on the film, and a functional layer (single layer part or multi-layered part) that is sandwiched between the electrodes, contains an organic light-emitting substance, and has a thickness of only about 0.1 μm. When a relatively low voltage of about 2 to 20 V is applied to such an organic EL device, electrons and holes are injected into the organic compound layer from the negative electrode and the positive electrode, respectively. It is known that these electrons and holes recombine in the light-emitting layer, and energy is emitted as light when the energy level returns from the conduction band to the valence band so that luminescence occurs. This technique is expected to be applied to next-generation flat displays or lighting devices.

As one of measures for preventing global warming, the application of the technique to lighting devices that account for a large proportion of energy consumption for people has begun to be examined. Attempts have been actively made to improve the performance and reduce the cost of a white light-emitting panel, which can be an alternative to conventional lighting devices, for its practical use.

A white light-emitting panel for lighting is required to have high efficiency and long service life. In fact, however, a white light-emitting panel using an organic EL device is inferior to a fluorescent light or a white-light LED in terms of an increase in service life.

As a method for solving such a problem, there is a method using an inorganic light-emitting substance, "quantum dot material" as a light-emitting material.

A quantum dot material has a sharp emission spectrum, is an inorganic material and therefore excellent in durability, and is soluble in various solvents and therefore applicable to a coating process.

For example, Patent Literature 1 discloses an electroluminescence element having a light-emitting layer containing a quantum dot material.

Further, Patent Literature 2 discloses an organic electroluminescence element in which a light-emitting layer contains a phosphorescence-emitting dopant and the light-emitting layer or a layer adjacent to the light-emitting layer is doped with a quantum dot material.

CITATION LIST

Patent Literature

Patent Literature 1: JP 2009-99544 A
Patent Literature 2: JP 2012-169460 A

SUMMARY OF INVENTION

Technical Problem

However, according to a technique disclosed in Patent Literature 1, two or more light-emitting layers need to be laminated to produce a white light-emitting element for lighting purpose or the like, which complicates a production method and the selection of a solvent used for forming each of the light-emitting layers. Further, the element has a sharp emission spectrum and is therefore poor in color rendering properties.

Further, according to a technique disclosed in Patent Literature 2, a phosphorescence-emitting material is used. Therefore, the element quickly deteriorates and has a problem with durability. Strictly, the service life of the element is not adequate as a white light-emitting element, and therefore the technique disclosed in Patent Literature 2 leaves room for improvement in this respect.

The present invention has been made in light of the above problems and circumstances, and an object thereof is to provide an electroluminescence element that is excellent in color rendering properties and has a long service life as a white light-emitting element, that is, high durability.

Solution to Problem

Specifically, the above object of the present invention is achieved by the following aspects.

1. An electroluminescence element including: a substrate; a first electrode; a functional layer including at least one light-emitting layer; and a second electrode, wherein the at least one light-emitting layer contains a quantum dot material, and when a particle size at a cumulative frequency of 10% and a particle size at a cumulative frequency of 90% in a volume-based cumulative particle size distribution of the quantum dot material are defined as d10 (nm) and d90 (nm), respectively, the quantum dot material satisfies d90−d10 ≥3 nm.

2. The electroluminescence element according to the above 1, wherein the quantum dot material satisfies d90−d10≥5 nm.

3. The electroluminescence element according to the above 1 or 2, wherein when a half width of a maximum peak in the volume-based particle size distribution is defined as t (nm), the quantum dot material satisfies t/(d90−d10)>0.5.

4. The electroluminescence element according to any one of the above 1 to 3, wherein the quantum dot material includes a core and a shell surrounding the core.

5. The electroluminescence element according to any one of the above 1 to 4, wherein the quantum dot material is surface-modified with a surface modifier.

Advantageous Effects of Invention

According to the present invention, it is possible to provide an electroluminescence element that is excellent in color rendering properties and has a long service life as a white light-emitting element, that is, high durability.

DESCRIPTION OF EMBODIMENTS

Hereinbelow, the present invention, components thereof, and embodiments for carrying out the present invention will be described in detail. It is to be noted that in this specification, "to" is used to express a range including values described before and after "to" as a lower limit value and an upper limit value, respectively.

First, the structure of an electroluminescence element according to the present invention will be schematically described. Then, each of the major layers of the electroluminescence element will be described in detail, and then a method for producing the electroluminescence element will be described.

<Structure of Electroluminescence Element (Summary)>

Figure 1:
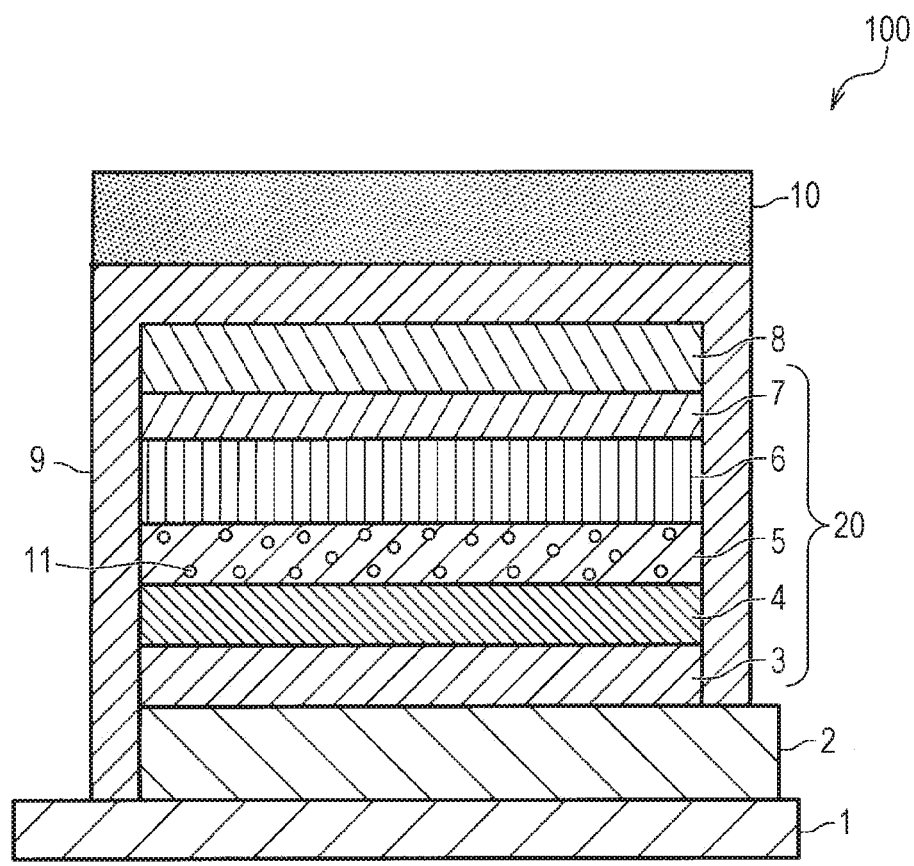
FIG. 1 is a schematic sectional view that illustrates the schematic structure of an electroluminescence element according to an embodiment of the present invention.

As illustrated in FIG. 1, an electroluminescence element 100 according to a preferred embodiment of the present invention has a flexible substrate (substrate) 1. On the flexible substrate 1, a positive electrode (first electrode) 2 is formed. On the positive electrode 2, functional layers 20 are formed. On the functional layers 20, a negative electrode (second electrode) 8 is formed.

The functional layers 20 refer to individual layers provided between the positive electrode 2 and the negative electrode 8 to constitute the electroluminescence element 100.

The functional layers 20 include, for example, a hole injection layer 3, a hole transport layer 4, a light-emitting layer 5, an electron transport layer 6, and an electron injection layer 7, and may further include a hole-blocking layer, an electron-blocking layer, and the like.

The positive electrode 2, the functional layers 20, and the negative electrode 8 on the flexible substrate 1 are sealed with a flexible sealing member 10 via a sealing adhesive 9.

It is to be noted that such a layer structure of the electroluminescence element 100 (see FIG. 1) is merely a preferred specific example, and the present invention is not limited thereto. For example, the electroluminescence element 100 according to the present invention may have any of layer structures (i) to (viii):

(i) flexible substrate/positive electrode/light-emitting layer/electron transport layer/negative electrode/heat conductive layer/sealing adhesive/sealing member;

(ii) flexible substrate/positive electrode/hole transport layer/light-emitting layer/electron transport layer/negative electrode/heat conductive layer/sealing adhesive/sealing member;

(iii) flexible substrate/positive electrode/hole transport layer/light-emitting layer/hole-blocking layer/electron transport layer/negative electrode/heat conductive layer/sealing adhesive/sealing member;

(iv) flexible substrate/positive electrode/hole transport layer/light-emitting layer/hole-blocking layer/electron transport layer/negative electrode buffer layer/negative electrode/heat conductive layer/sealing adhesive/sealing member;

(v) flexible substrate/positive electrode/positive electrode buffer layer/hole transport layer/light-emitting layer/hole-blocking layer/electron transport layer/negative electrode buffer layer/negative electrode/heat conductive layer/sealing adhesive/sealing member;

(vi) glass support/positive electrode/hole injection layer/light-emitting layer/electron injection layer/negative layer/sealing member;

(vii) glass support/positive electrode/hole injection layer/hole transport layer/light-emitting layer/electron injection layer/negative electrode/sealing member; and (viii) glass support/positive electrode/hole injection layer/hole transport layer/light-emitting layer/electron-transport layer/electron injection layer/negative electrode/sealing member.

<Functional Layers 20 of Electroluminescence Element>

Hereinbelow, the functional layers constituting the electroluminescence element according to the present invention will be described in detail.

(1) Injection Layers: Hole Injection Layer 3 and Electron Injection Layer 7

In the electroluminescence element according to the present invention, injection layers may be provided, if necessary. The injection layers include an electron injection layer and a hole injection layer. As described above, the hole injection layer and the electron injection layer may be provided between the positive electrode and the light-emitting layer or the hole transport layer and between the negative electrode and the light-emitting layer or the electron transport layer, respectively.

In the present invention, the injection layers refer to layers provided between the electrode and the functional layer to reduce driving voltage and improve luminance. The injection layers are described in detail in Chapter 2 "Electrode Materials" (pp. 123 to 166) of Section 2 of The Front Line of Organic EL Devices and Their Industrialization (published by NTS Inc., Nov. 30, 1998), and include a hole injection layer and an electron injection layer.

The hole injection layer is described in detail also in, for example, JP 9-45479 A, JP 9-260062 A, and JP 8-288069 A. Examples of a hole injection material applicable to the hole injection layer include: polymers or aniline-based copolymers containing a triazole derivative, an oxadiazole derivative, an imidazole derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, or the like; polyarylalkane derivatives; and conductive polymers. Preferred examples thereof include Polythiophene derivatives, polyaniline derivatives, and polypyrrole derivatives, and more preferred examples thereof include polythiophene derivatives.

The electron injection layer is described in detail also in, for example, JP 6-325871 A, JP 9-17574 A, and JP 10-74586 A. Specific examples of the electron injection layer include a buffer layer made of a metal typified by strontium or aluminum, a buffer layer made of an alkali metal compound typified by lithium fluoride, a buffer layer made of an alkaline earth metal compound typified by magnesium fluoride, and a buffer layer made of an oxide typified by aluminum oxide. In the present invention, the buffer layer (injection layer) is desirably a very thin film and is preferably made of potassium fluoride or sodium fluoride. The thickness of the buffer layer is about 0.1 nm to 5 m, preferably 0.1 to 100 nm, more preferably 0.5 to 10 nm, most preferably 0.5 to 4 nm.

(2) Hole Transport Layer 4

A hole transport material used to form the hole transport layer may be the same as a compound applicable to the hole injection layer. The hole transport material is preferably a porphyrin compound, an aromatic tertiary amine compound, or a styrylamine compound, and is particularly preferably an aromatic tertiary amine compound.

Typical examples of the aromatic tertiary amine compound and the styrylamine compound include: N,N,N',N'-tetraphenyl-4,4'-diaminophenyl; N,N'-diphenyl-N,N'-bis(3-methylphenyl)-1,1'-biphenyl-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylphenyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenyl ether; 4,4'-bis(diphenylamino)quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostyrylbenzene; N-phenylcarbazole; a compound having two condensed aromatic rings in its molecule described in U.S. Pat. No. 5,061,569, such as 4,4'-bis[N-(1-naphthyl)-N-phenylamino]biphenyl (NPD); and 4,4',4''-tris[N-(3-methylphenyl)-N-phenylamino]triphenylamine (MTDATA) described in JP 4-308688 A and having three triphenylamine units connected in a starburst form.

Further, a polymer material obtained by introducing such a material into a polymer chain or a polymer material having such a material as a polymer main chain may also be used. Further, an inorganic compound such as p-type Si or p-type SiC may also be used as the hole injection material or the hole transport material.

Further, a hole transport material having so-called p-type semiconducting properties may also be used, such as one described in JP 4-297076 A, JP 2000-196140 A, JP 2001-102175 A, J. Appl. Phys., 95, 5773 (2004), JP 11-251067 A, document written by J. Huang et. al. (Applied Physics Letters 80 (2002), p. 139), or JP 2003-519432 W.

The hole transport layer can be formed by forming the hole transport material into a thin film by a known method such as vacuum deposition, spin coating, casting, printing including ink-jet printing, or LB method. The thickness of the hole transport layer is not particularly limited, but is usually about 5 nm to 5 μm, preferably 5 to 200 nm. The hole transport layer may have a single-layer structure made of one or two or more of the above-mentioned materials.

Preferred specific examples ((1) to (60)) of the compound used as the hole transport material in the electroluminescence element according to the present invention are shown below, but the present invention is not limited thereto.

[Chemical Formula 1]

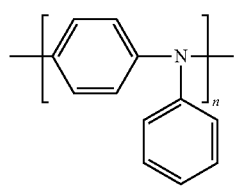

(1)

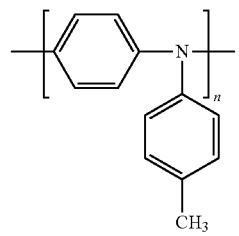

(2)

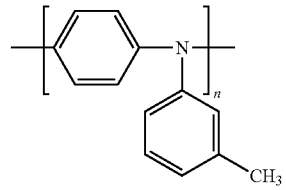

(3)

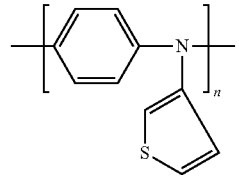

(4)

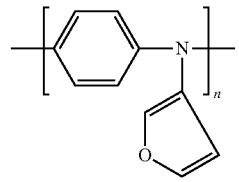

(5)

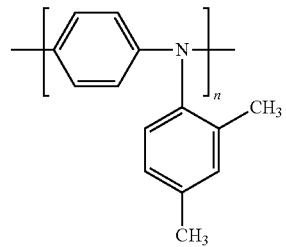

(6)

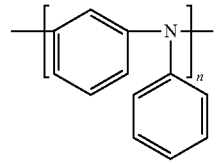

(7)

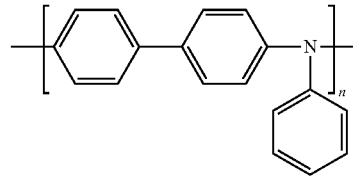

(8)

(9) 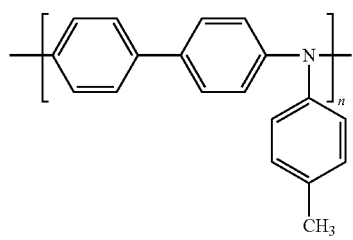
(10) 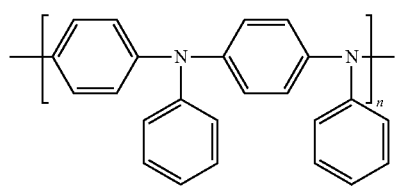
(11) 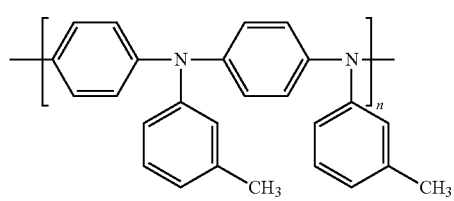
(12) 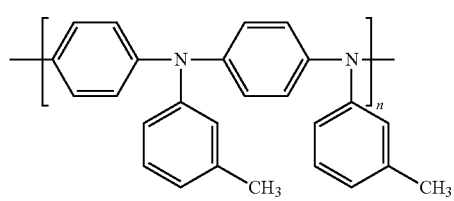
(13) 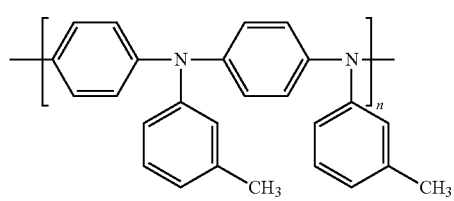
(14) 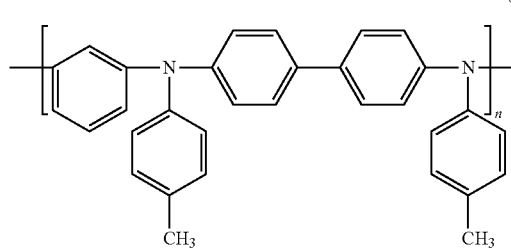
(15) 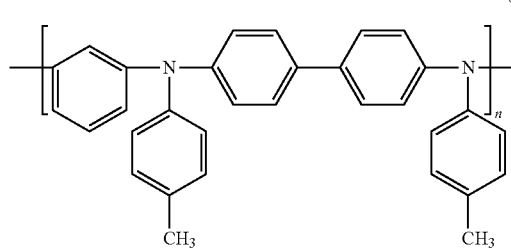
[Chemical Formula 2]
(16) 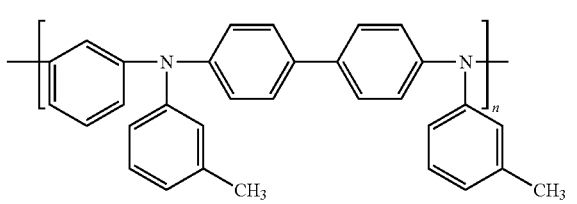
(17) 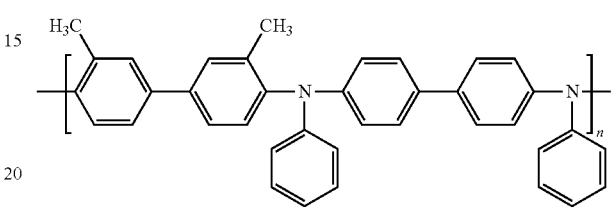
(18) 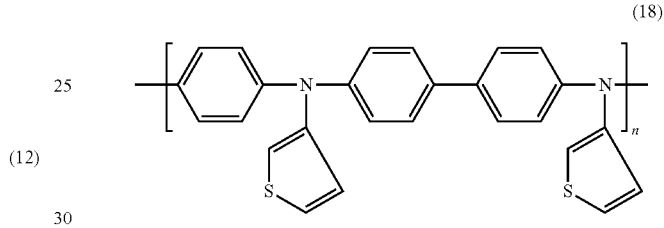
(19) 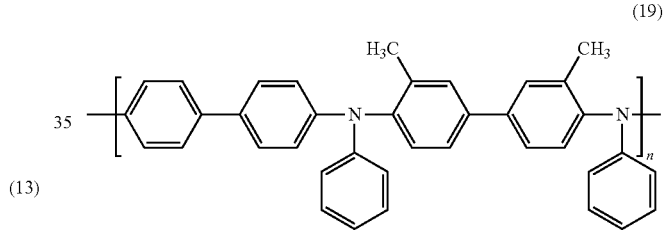
(20) 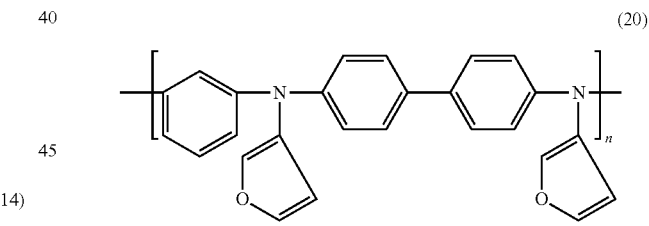
(21) 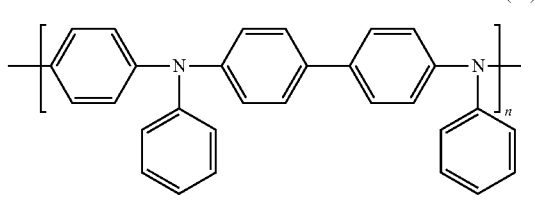
(22) 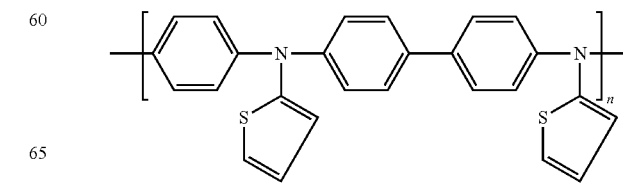

(23)
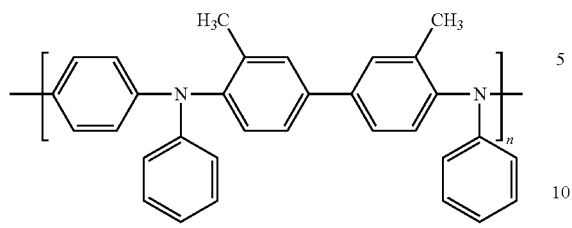
(24)
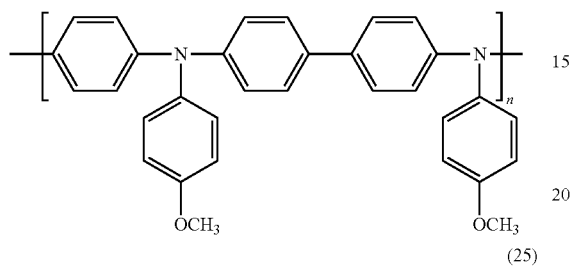
(25)
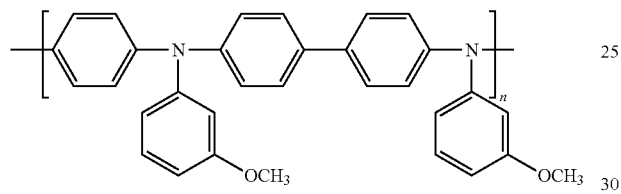
[Chemical Formula 3]
(26)
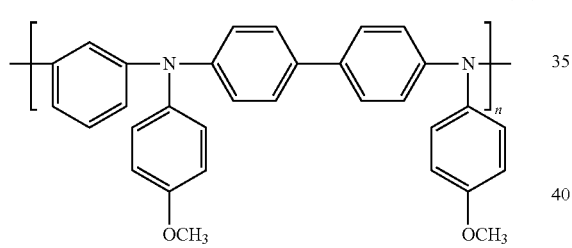
(27)
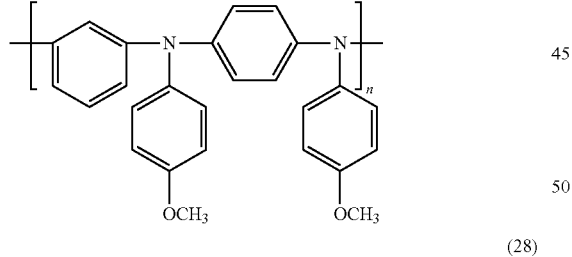
(28)
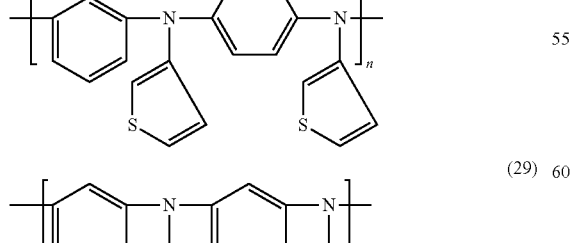
(29)
(30)
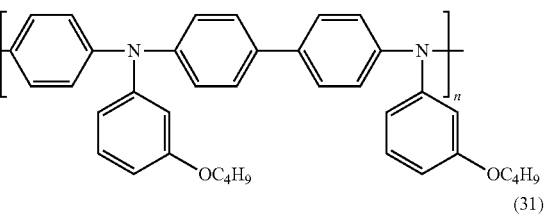
(31)
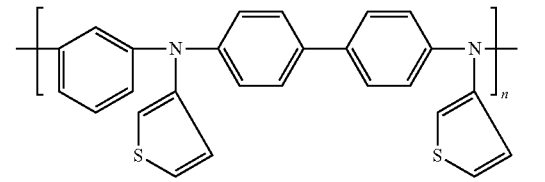
(32)
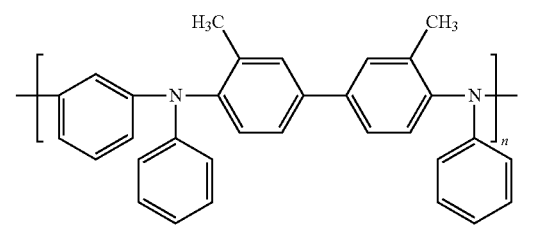
(33)
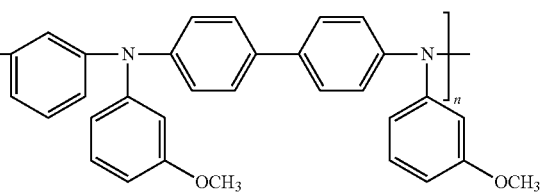
(34)
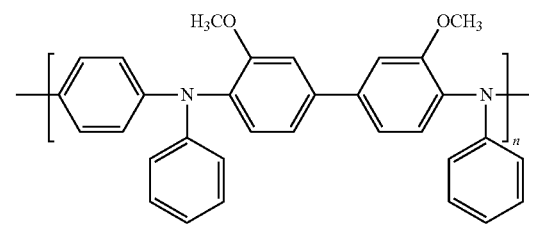
(35)
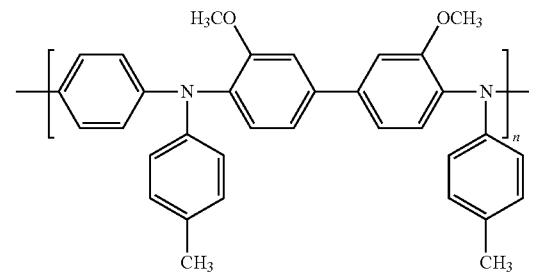

-continued
[Chemical Formula 4]
(36)
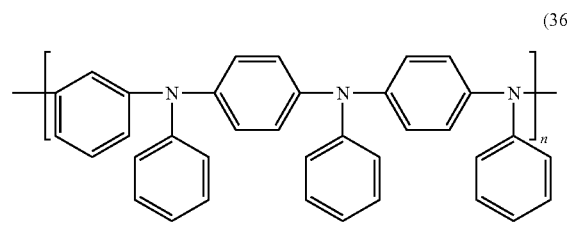
(37)
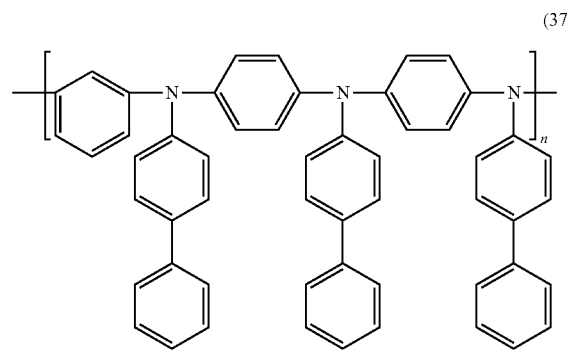
(38)
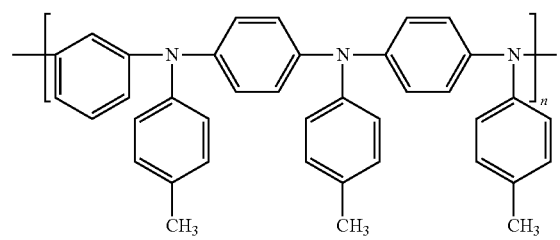
(39)
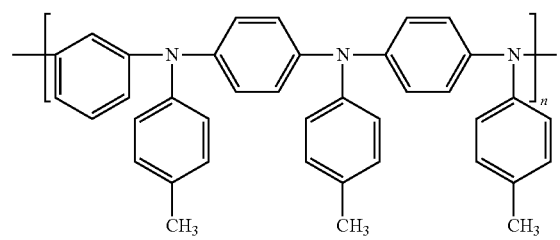
(40)
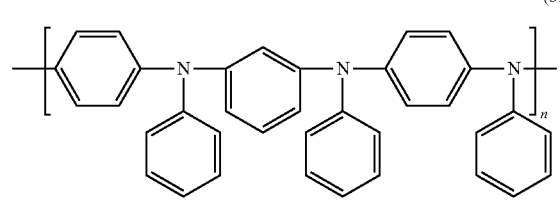
(41)
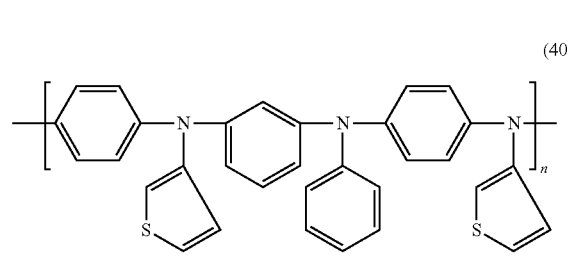
-continued
(42)
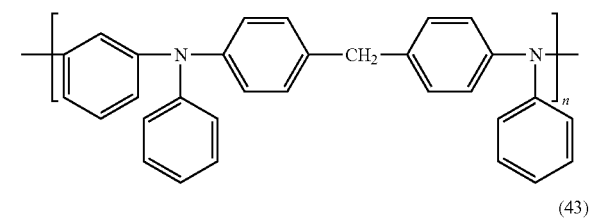
(43)
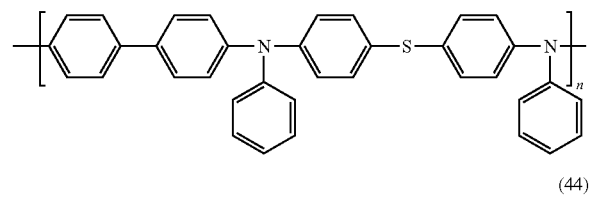
(44)
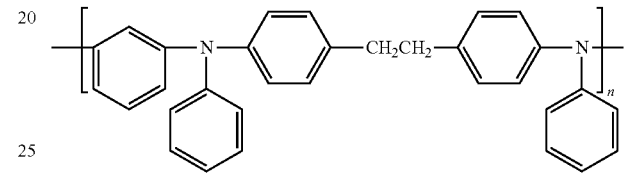
[Chemical Formula 5]
(45)
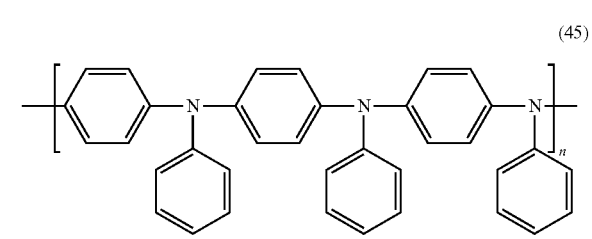
(46)
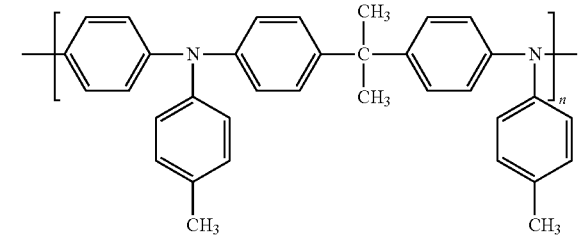
(47)
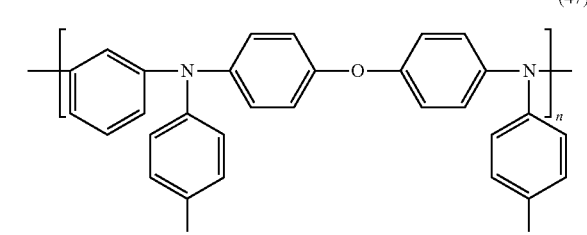
(48)
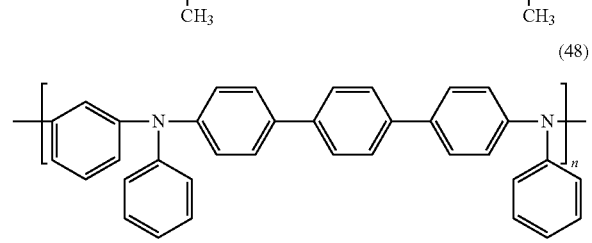

[Chemical Formula 6]
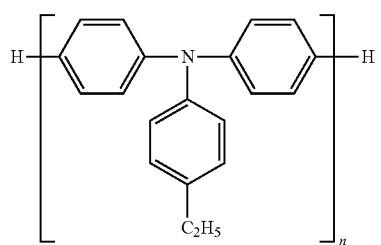
(49)
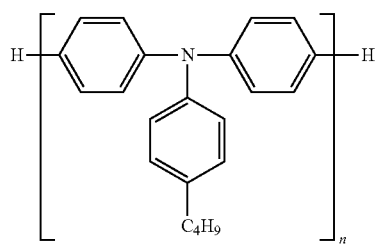
(50)
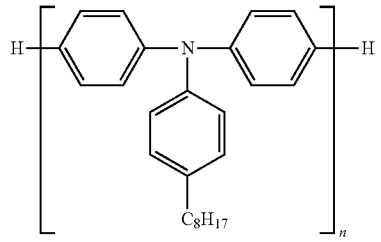
(51)
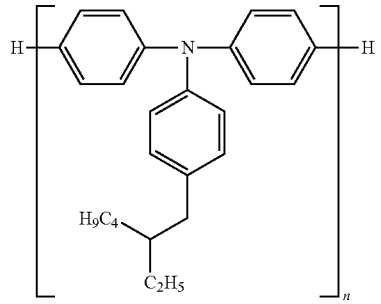
(52)
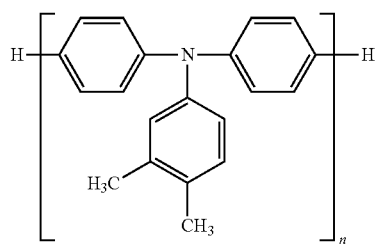
(53)
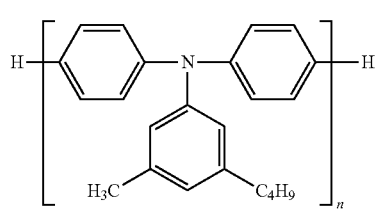
(54)
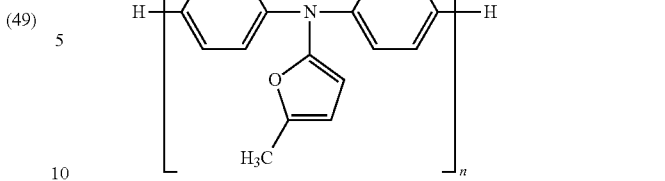
(55)
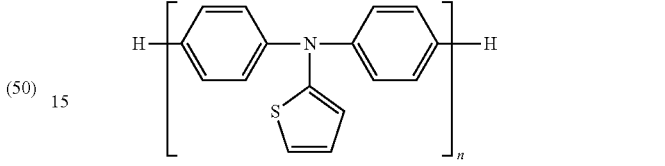
(56)
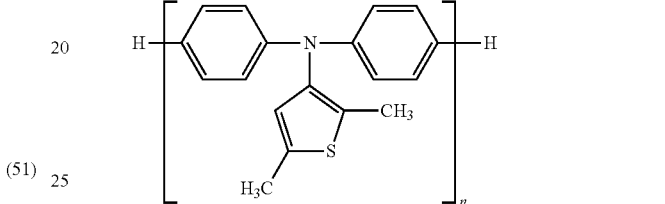
(57)
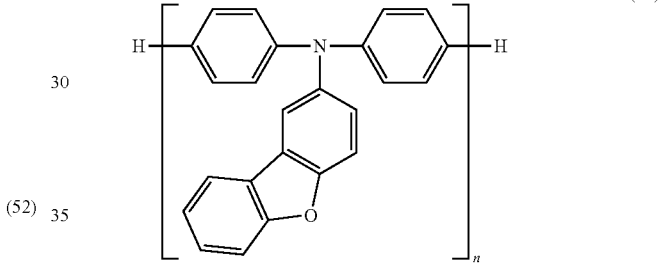
(58)
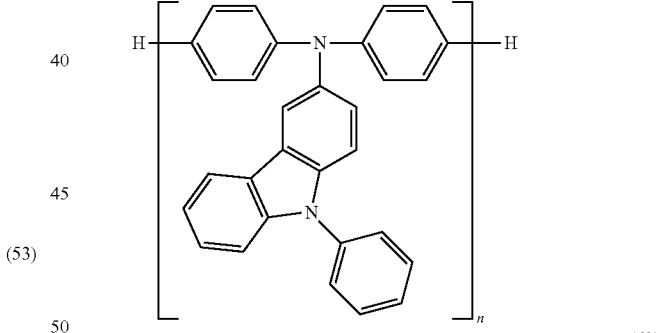
(59)
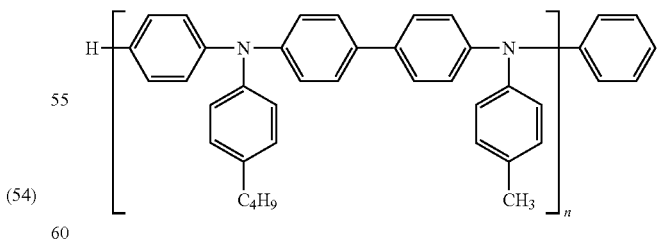
(60)
It is to be noted that n in each of the formulas of the compounds exemplified above represents the degree of polymerization and is such an integer that the weight-average molecular weight of the compound is in the range of 50,000 to 200,000. If the weight-average molecular weight is less than the above lower limit, there is a fear that the hole transport layer is mixed with another layer during film formation due to its high solubility in solvent. Even if film formation can be performed, high luminous efficacy cannot be achieved due to a low molecular weight of the compound. If the weight-average molecular weight is larger than the above upper limit, problems are caused by difficulty in synthesis and purification. The range of molecular weight distribution increases and the amount of residual impurities also increases, which deteriorates the luminous efficacy, voltage, and service life of the electroluminescence element.

These polymer compounds can be synthesized by a known method described in, for example, Makromol. Chem., 193, p. 909 (1992).

(3) Electron Transport Layer 6

The electron transport layer is made of a material having the function of transporting electrons. In a broad sense, the electron injection layer and the hole-blocking layer are also included in the electron transport layer. The electron transport layer may be composed of a single layer or two or more layers.

An electron transport material (also serving as a hole-blocking material) conventionally used in the single electron transport layer or, in the case of the electron transport layer composed of two or more layers, the electron transport layer adjacent to the light-emitting layer on the negative electrode side may have the function of transporting electrons injected from the negative electrode to the light-emitting layer. Such an electron transport material can be arbitrarily selected from conventionally-known compounds, and examples thereof include fluorene derivatives, carbazole derivatives, azacarbazole derivatives, oxadiazole derivatives, triazole derivatives, silole derivatives, pyridine derivatives, pyrimidine derivatives, and metal complexes of 8-quinolinol derivatives.

Other preferred examples of the electron transport material include metal-free phthalocyanine, metal phthalocyanine, and metal-free phthalocyanine and metal phthalocyanine that are terminally substituted with an alkyl group or a sulfonic acid group.

In the present invention, among them, carbazole derivatives, azacarbazole derivatives, and pyridine derivatives are preferred, and azacarbazole derivatives are more preferred.

The electron transport layer can be formed by forming the electron transport material into a thin film by a known method such as spin coating, casting, printing including ink-jet printing, or LB method. The electron transport layer can be preferably formed by a wet process using a coating liquid containing the electron transport material and a fluoroalcohol solvent.

The thickness of the electron transport layer is not particularly limited, but is usually about 5 nm to 5 µm, preferably 5 to 200 nm. The electron transport layer may have a single layer structure made of one or two or more of the above-mentioned materials.

Alternatively, an electron transport layer doped with an impurity as a guest material to have a high n property may be used. Examples of such an electron transport layer include those described in JP 4-297076 A, JP 10-270172 A, JP 2000-196140 A, JP 2001-102175 A, and J. Appl. Phys., 95, 5773 (2004).

In the present invention, the electron transport layer preferably contains an alkali metal salt of an organic substance. The kind of the organic substance is not particularly limited, and examples of the organic substance include formate, acetate, propionate, butyrate, valerate, caproate, enanthate, caprylate, oxalate, malonate, succinate, benzoate, phthalate, isophthalate, terephthalate, salicylate, pyruvate, lactate, malate, adipate, mesylate, tosylate, and benzenesulfonate. The organic substance is preferably formate, acetate, propionate, butyrate, valerate, caproate, enanthate, caprylate, oxalate, malonate, succinate, or benzoate, and is more preferably an alkali metal salt of aliphatic carboxylic acid such as formate, acetate, propionate, or butyrate. The aliphatic carboxylic acid preferably has 4 or less carbon atoms. Most preferably, the organic substance is acetate.

The kind of alkali metal in the alkali metal salt of the organic substance is not particularly limited, and examples of the alkali metal include Na, K, and Cs. The alkali metal is preferably K or Cs, more preferably Cs. Examples of the alkali metal salt of the organic substance include combinations of the organic substance and the alkali metal. The alkali metal salt of the organic substance is preferably Li formate, K formate, Na formate, Cs formate, Li acetate, K acetate, Na acetate, Cs acetate, Li propionate, Na propionate, K propionate, Cs propionate, Li oxalate, Na oxalate, K oxalate, Cs oxalate, Li malonate, Na malonate, K malonate, Cs malonate, Li succinate, Na succinate, K succinate, Cs succinate, Li benzoate, Na benzoate, K benzoate, or Cs benzoate, is more preferably Li acetate, K acetate, Na acetate, or Cs acetate, and is most preferably Cs acetate.

The amount of such a dopant contained in the electron transport layer is preferably 1.5 to 35 mass %, more preferably 3 to 25 mass %, most preferably 5 to 15 mass % with respect to the mass of the electron transport layer.

(4) Light-Emitting Layer 5

The light-emitting layer constituting the electroluminescence element according to the present invention is a layer in which electrons and holes injected from the electrodes or the electron transport layer and the hole transport layer recombine to emit light. A light-emitting portion may be inside the light-emitting layer or may be the interface between the light-emitting layer and a layer adjacent to the light-emitting layer.

The structure of the light-emitting layer according to the present invention is not particularly limited as long as a light-emitting material contained therein satisfies a requirement specified in the present invention.

Further, the light-emitting layer may have two or more layers having the same emission spectrum or maximum emission wavelength. A non-light-emitting intermediate layer is preferably provided between light-emitting layers.

In the present invention, the light-emitting layer preferably has a total thickness in the range of 1 to 100 nm, and more preferably has a total thickness of 50 nm or less to achieve a lower driving voltage. It is to be noted that when a non-light-emitting intermediate layer is provided between light-emitting layers, the term "total thickness" used herein includes also the thickness of the intermediate layer.

The thickness of each light-emitting layer is preferably adjusted to be in the range of 1 to 50 nm.

Each light-emitting layer may emit blue light, green light, or red light, and the relationship among the thicknesses of the blue, green, and red light-emitting layers is not particularly limited.

The light-emitting layer can be formed by forming a light-emitting material or a host compound that will be described later into a film by a known thin film-forming method such as vacuum deposition, spin coating, casting, LB method, or ink-jet printing.

In the present invention, the light-emitting layer preferably contains a host compound and a quantum dot material so that the quantum dot material emits light.

(4.1) Host Compound

The host compound contained in the light-emitting layer of the electroluminescence element according to the present invention is preferably a compound whose phosphorescence quantum yield for phosphorescence emission at room temperature (25 C.) is less than 0.1. More preferably, the phosphorescence quantum yield is less than 0.01. Further, the volume ratio of the host compound to compounds contained in the light-emitting layer is preferably 50% or more.

As the host compound, a known host compound may be used singly, or two or more known host compounds may be used in combination. The use of two or more host compounds makes it possible to control charge transfer to increase the efficiency of the electroluminescence element. Further, the use of two or more light-emitting materials that will be described later makes it possible to mix different emitted lights to obtain a desired emission color.

Further, the light-emitting host used in the present invention may be a conventionally-known low-molecular compound, a high-molecular compound having a repeating unit, or a low-molecular compound having a polymerizable group such as a vinyl group or an epoxy group (polymerizable light-emitting host). However, when the high-molecular material is used, the compound incorporates a solvent so that a phenomenon such as swelling or gelling is likely to occur, in which the solvent is considered to be difficult to remove. In order to prevent such a phenomenon, it is preferred that the molecular weight of the light-emitting host is not high. More specifically, the light-emitting host to be used is preferably a material having a molecular weight of 2,000 or less during its application, and is more preferably a material having a molecular weight of 1,000 or less during its application.

The known host compound is preferably a compound that has hole transport capability and electron transport capability, prevents an increase in the wavelength of emitted light, and has high Tg (glass transition temperature). Here, the glass transition temperature (Tg) is a value determined by a method based on JIS-K-7121 using DSC (Differential Scanning Colorimetry).

Specific examples of the known host compound include compounds described in the following literatures such as JP 2001-257076 A, JP 2002-308855 A, JP 2001-313179 A, JP 2002-319491 A, JP 2001-357977 A, JP 2002-334786 A, JP 2002-8860 A, JP 2002-334787 A, JP 2002-15871 A, JP 2002-334788 A, JP 2002-43056A, JP 2002-334789 A, JP 2002-75645 A, JP 2002-338579 A, JP 2002-105445 A, JP 2002-343568 A, JP 2002-141173 A, JP 2002-352957 A, JP 2002-203683 A, JP 2002-363227 A, JP 2002-231453 A, JP 2003-3165 A, JP 2002-234888 A, JP 2003-27048 A, JP 2002-255934 A, JP 2002-260861 A, JP 2002-280183 A, JP 2002-299060 A, JP 2002-302516 A, JP 2002-305083 A, JP 2002-305084 A, and JP 2002-308837 A.

The host compound used in the present invention is preferably a carbazole derivative.

The host compound is preferably a compound represented by the following general formula (1).

[Chemical Formula 7]

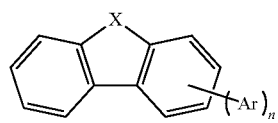

General Formula (1)

In the general formula (1), X is NR', O, S, CR'R", or SiR'R", R' and R" are each a hydrogen atom or a substituent group, Ar is an aromatic ring, and n is an integer of 0 to 8.

Examples of the substituent group represented by R' or R" in X in the general formula (1) include: alkyl groups (e.g., methyl group, ethyl group, propyl group, isopropyl group, t-butyl group, pentyl group, hexyl group, octyl group, dodecyl group, tridecyl group, tetradecyl group, and pentadecyl group); cycloalkyl groups (e.g., cyclopentyl group and cyclohexyl group); alkenyl groups (e.g., vinyl group and allyl group); alkynyl groups (e.g., ethynyl group and propargyl group); aromatic hydrocarbon ring groups (also referred to as aromatic carbocyclic groups or aryl groups, e.g., phenyl group, p-chlorophenyl group, mesityl group, tolyl group, xylyl group, naphthyl group, anthryl group, azulenyl group, acenaphthenyl group, fluorenyl group, phenanthryl group, indenyl group, pyrenyl group, and biphenylyl group); aromatic heterocyclic groups (e.g., pyridyl group, pyrimidinyl group, furyl group, pyrrolyl group, imidazolyl group, benzoimidazolyl group, pyrazolyl group, pyrazinyl group, triazolyl group (e.g., 1,2,4-triazole-1-yl group and 1,2,3-triazole-1-yl group), oxazolyl group, benzoxazolyl group, thiazolyl group, isoxazolyl group, isothiazolyl group, furazanyl group, thienyl group, quinolyl group, benzofuryl group, dibenzofuryl group, benzothienyl group, dibenzothienyl group, indolyl group, carbazolyl group, carbolinyl group, diazacarbazolyl (which refers to a group obtained by substituting one of carbon atoms constituting a carboline ring of the carbolinyl group with a nitrogen atom), quinoxalinyl group, pyridazinyl group, triazinyl group, quinazolinyl group, and phthalazinyl group); heterocyclic groups (e.g., pyrrolidinyl group, imidazolidinyl group, morpholinyl group, and oxazolydinyl group); alkoxy groups (e.g., methoxy group, ethoxy group, propyloxy group, pentyloxy group, hexyloxy group, octyloxy group, and dodecyloxy group); cycloalkoxy groups (e.g., cyclopentyloxy group and cyclohexyloxy group); aryloxy groups (e.g., phenoxy group and naphthyloxy group); alkylthio groups (e.g., methylthio group, ethylthio group, propylthio group, pentylthio group, hexylthio group, octylthio group, and dodecylthio group); cycloalkylthio groups (e.g., cyclopentylthio group and cyclohexylthio groups); arylthio groups (e.g., phenylthio and naphthylthio group); alkoxycarbonyl groups (e.g., methyloxycarbonyl group, ethyloxycarbonyl group, butyloxycarbonyl group, octyloxycarbonyl group, and dodecyloxycarbonyl group); aryloxycarbonyl groups (e.g., phenyloxycarbonyl group and naphthyloxycarbonyl group); sulfamoyl groups (e.g., aminosulfonyl group, methylaminosulfonyl group, dimethylaminosulfonyl group, butylaminosulfonyl group, hexylaminosulfonyl group, cyclohexylaminosulfonyl group, octylaminosulfonyl group, dodecylaminosulfonyl group, phenylaminosulfonyl group, naphthylaminosulfonyl group, and 2-pyridylaminosulfonyl group); acyl groups (e.g., acetyl group, ethylcarbonyl group, propylcarbonyl group, pentylcarbonyl group, cyclohexylcarbonyl group, octylcarbonyl group, 2-ethylhexylcarbonyl group, dodecylcarbonyl group, phenylcarbonyl group, naphthylcarbonyl group, and pyridylcarbonyl group); acyloxy groups (e.g., acetyloxy group, ethylcarbonyloxy group, butylcarbonyloxy group, octylcarbonyloxy group, dodecylcarbonyloxy group, and phenylcarbonyloxy group); amide groups (e.g., methylcarbonylamino group, ethylcarbonylamino group, dimethylcarbonylamino group, propylcarbonylamino group, pentylcarbonylamino group, cyclohexylcarbonylamino group, 2-ethylhexylcarbonylamino group, octylcarbonylamino group, dodecylcarbonylamino group, phenylcarbonylamino group, and naphthylcarbonylamino group); carbamoyl groups (e.g., aminocarbonyl group, methylaminocarbonyl group, dimethylaminocarbonyl group, propylaminocarbonyl group, pentylaminocarbonyl group, cyclohexylaminocarbonyl group, octylaminocarbonyl group, 2-ethylhexylaminocarbonyl group, dodecylaminocarbonyl group, phenylaminocarbonyl group, naphthylaminocarbonyl group, and 2-pyridylaminocarbonyl group); ureido groups (e.g., methylureido group, ethylureido group, pentylureido group, cyclohexylureido group, octylureido group, dodecylureido group, phenylureido group, naphthylureido group, and 2-pyridylaminoureido group); sulfinyl groups (e.g., methylsulfinyl group, ethylsulfinyl group, butylsulfinyl group, cyclohexylsulfinyl group, 2-ethylhexylsulfinyl group, dodecylsulfinyl group, phenylsulfinyl group, naphthylsulfinyl group, and 2-pyridylsulfinyl group); alkylsulfonyl groups (e.g., methylsulfonyl group, ethylsulfonyl group, butylsulfonyl group, cyclohexylsulfonyl group, 2-ethylhexylsulfonyl group, and dodecylsulfonyl group); arylsulfonyl groups or heteroarylsulfonyl groups (e.g., phenylsulfonyl group, naphthylsulfonyl group, and 2-pyridylsulfonyl group); amino groups (e.g., amino group, ethylamino group, dimethylamino group, butylamino group, cyclopentylamino group, 2-ethylhexylamino group, dodecylamino group, aniline group, naphthylamino group, and 2-pyridylamino group); halogen atoms (e.g., fluorine atom, chlorine atom, and bromine atom); fluorohydrocarbon groups (e.g., fluoromethyl group, trifluoromethyl group, pentafluoroethyl group, and pentafluorophenyl group); a cyano group; a nitro group; a hydroxyl group; a mercapto group; and silyl groups (e.g., trimethylsilyl group, triisopropylsilyl group, triphenylsilyl group, and phenyldiethylsilyl group). These substituent groups may further be substituted with the above substituent group. These substituent groups may be bonded to each other to form a ring.

Particularly, X is preferably NR' or O. Particularly preferred examples of R' include aromatic hydrocarbon groups (also referred to as aromatic carbocyclic groups or aryl groups, e.g., phenyl group, p-chlorophenyl group, mesityl group, tolyl group, xylyl group, naphthyl group, anthryl group, azulenyl group, acenaphthenyl group, fluorenyl group, phenanthryl group, indenyl group, pyrenyl group, and biphenylyl group); and aromatic heterocyclic groups (e.g., furyl group, thienyl group, pyridyl group, pyridazinyl group, pyrimidinyl group, pyrazinyl group, triazinyl group, imidazolyl group, pyrazolyl group, thiazolyl group, quinazolinyl group, and phthalazinyl group).

The aromatic hydrocarbon groups and the aromatic heterocyclic groups may each have a substituent group represented by R' or R" in X of the general formula (1).

The aromatic ring represented by Ar in the general formula (1) is an aromatic hydrocarbon ring or an aromatic heterocyclic ring. The aromatic ring may be either a monocyclic ring or a fused ring. Further, the aromatic ring may be either unsubstituted or substituted with a substituent group represented by R' or R" in X of the general formula (1).

Examples of the aromatic hydrocarbon ring represented by Ar in the general formula (1) include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, a m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, and an anthranthrene ring. These rings may further have a substituent group represented by R' or R" in X of a partial structure represented by the general formula (1).

Examples of the aromatic heterocyclic ring represented by Ar in a partial structure represented by the general formula (1) include a furan ring, a dibenzofuran ring, a thiophene ring, an oxazole ring, a pyrrole ring, a pyridine ring, a pyridazine ring, a pyrimidine ring, a pyrazine ring, a triazine ring, a benzoimidazole ring, an oxadiazole ring, a triazole ring, an imidazole ring, a pyrazole ring, a thiazole ring, an indole ring, an indazole ring, a benzoimidazole ring, a benzothiazole ring, a benzoxazole ring, a quinoxaline ring, a quinazoline ring, a cinnoline ring, a quinoline ring, an isoquinoline ring, a phthalazine ring, a naphthyridine ring, a carbazole ring, a carboline ring, and a diazacarbazole ring (that refers to a ring obtained by further substituting one of the carbon atoms of a hydrocarbon ring constituting a carboline ring with a nitrogen atom).

These rings may further have a substituent group represented by R' or R" in the general formula (1).

Among the above-mentioned rings, the aromatic ring represented by Ar in the general formula (1) is preferably a carbazole ring, a carboline ring, a dibenzofuran ring, or a benzene ring, more preferably a carbazole ring, a carboline ring, or a benzene ring, even more preferably a benzene ring having a substituent group, particularly preferably a benzene ring having a carbazolyl group.

A preferred example of the aromatic ring represented by Ar in the general formula (1) is a fused ring having three or more rings. Specific examples of an aromatic hydrocarbon fused ring in which three or more rings are fused together include a naphthacene ring, an anthracene ring, a tetracene ring, a pentacene ring, a hexacene ring, a phenanthrene ring, a pyrene ring, a benzopyrene ring, a benzoazulene ring, a chrysene ring, a benzochrysene ring, an acenaphthene ring, an acenaphthylene ring, a triphenylene ring, a coronene ring, a benzocoronene ring, a hexabenzocoronene, ring, a fluorene ring, a benzofluorene ring, a fluoranthene ring, a perylene ring, a naphthoperylene ring, a pentabenzoperylene ring, a benzoperylene ring, a pentaphene ring, a picene ring, a pyranthrene ring, a coronene ring, a naphthocoronene ring, an ovalene ring, and an anthranthrene ring. It is to be noted that these rings may further have the above substituent group.

Specific examples of an aromatic heterocyclic ring in which three or more rings are fused together include an acridine ring, a benzoquinoline ring, a carbazole ring, a carboline ring, a phenazine ring, a phenanthridine ring, a phenanthroline ring, a carboline ring, a cyclazine ring, a quindoline ring, a thebenidine ring, a quinindoline ring, a triphenodithiazine ring, a triphenodioxazine ring, a phenanthrazine ring, an anthrazine ring, a perimidine ring, a diazacarbazole ring (that refers to a ring obtained by substituting any one of carbon atoms constituting a carboline ring with a nitrogen atom), a phenanthroline ring, a dibenzofuran ring, a dibenzothiophene ring, a naphthofuran ring, a naphthothiophene ring, a benzodifuran ring, a benzodithiophene ring, a naphthodifuran ring, a naphthodithiophene ring, an anthrafuran ring, an anthradifuran ring, an anthrathiophene ring, an anthradithiophene ring, a thianthrene ring, a phenoxathiin ring, and a thiophanthrene ring (naphthothiophene ring). It is to be noted that these rings may further have a substituent group.

It is to be noted that in the general formula (1), n is an integer of 0 to 8, but is preferably an integer of 0 to 2. Particularly, when X is O or S, n is preferably an integer of 1 or 2.

In the present invention, the host compound particularly preferably has both a dibenzofuran ring and a carbazole ring.

Hereinbelow, specific examples of the host compound represented by the general formula (1) (a-1 to a-41) are shown below, but the host compound is not limited thereto.

[Chemical Formula 8]
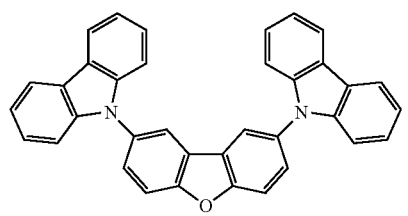
a-1
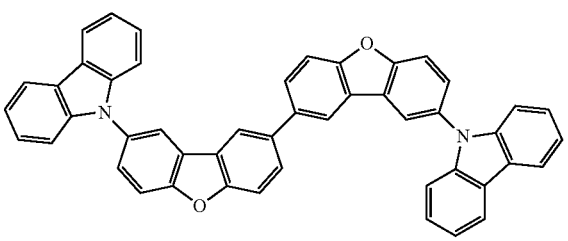
a-2
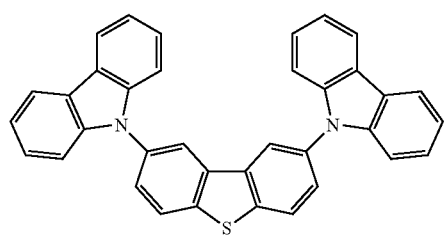
a-3
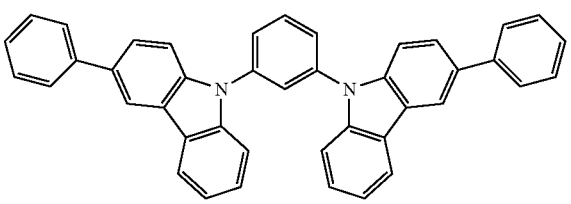
a-4
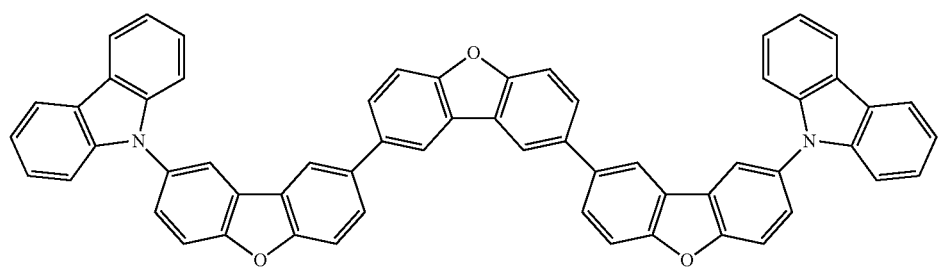
a-5
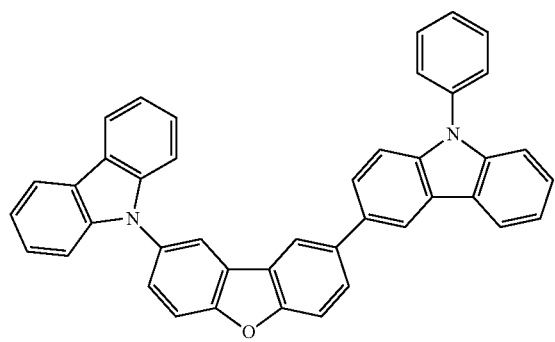
a-6
[Chemical Formula 9]
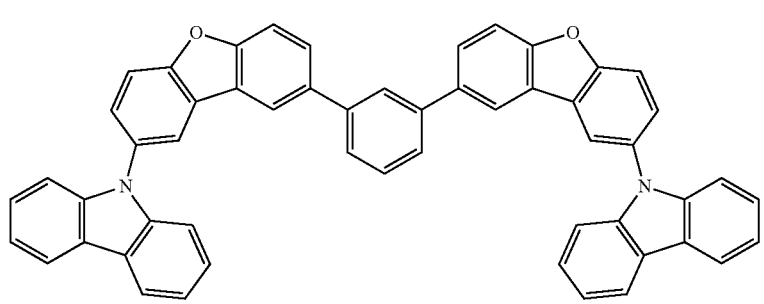
a-7 a-8
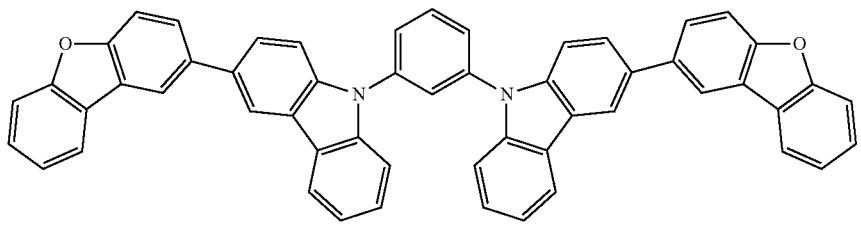
a-9
a-10
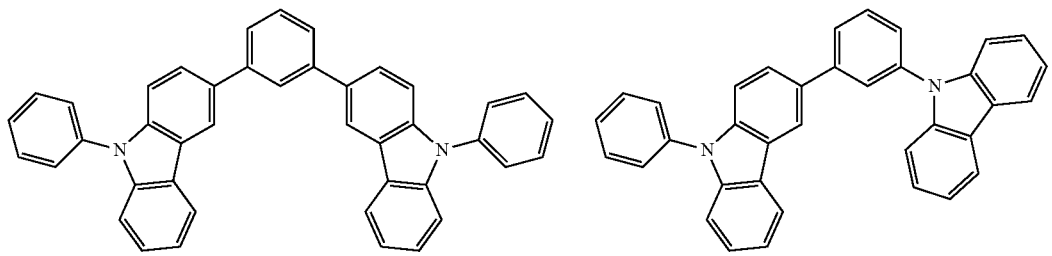
a-11
a-12
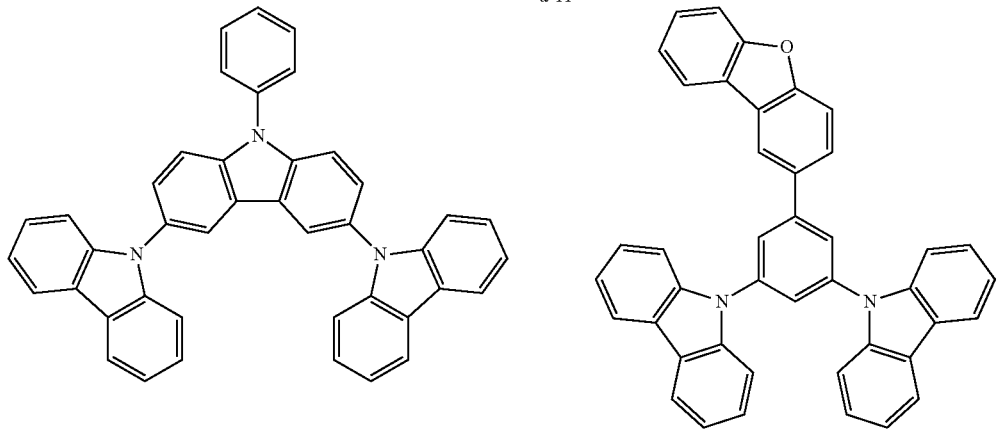
[Chemical Formula 10]
a-13
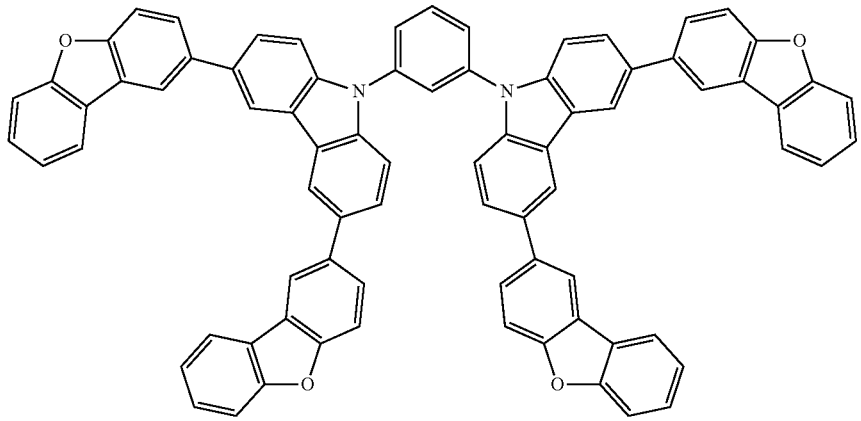

-continued
a-14
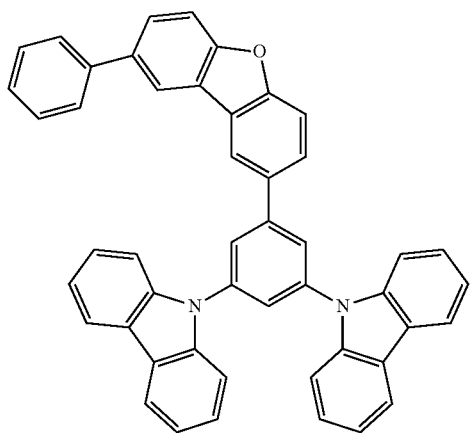
a-15
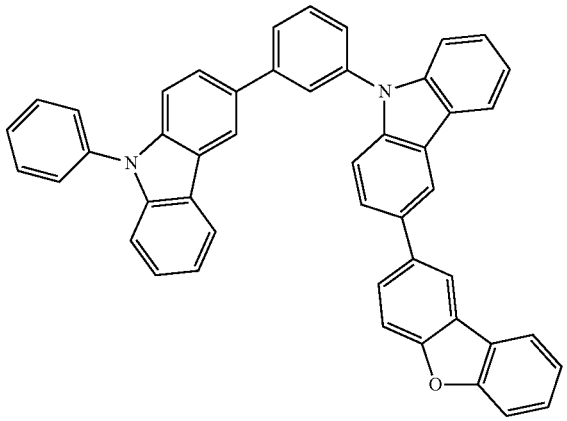
a-16
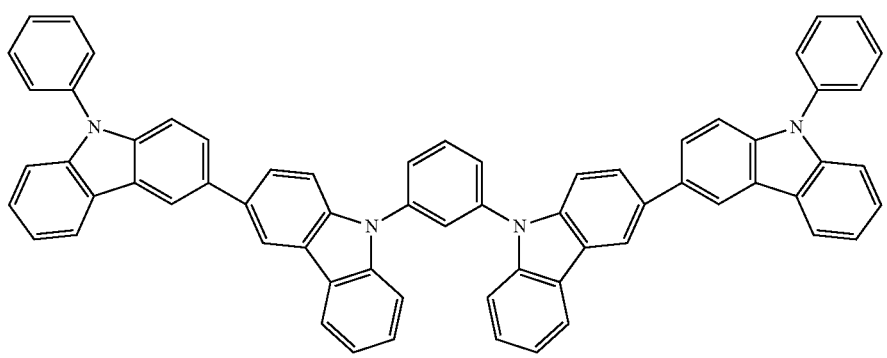
a-17
a-18
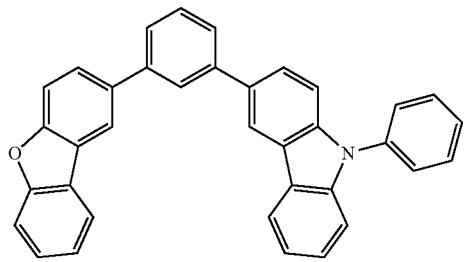
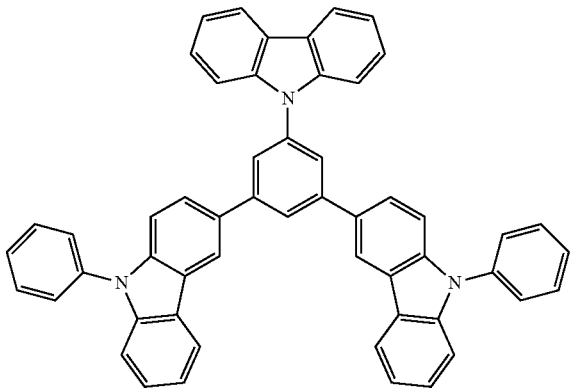
[Chemical Formula 11]
a-19
a-20
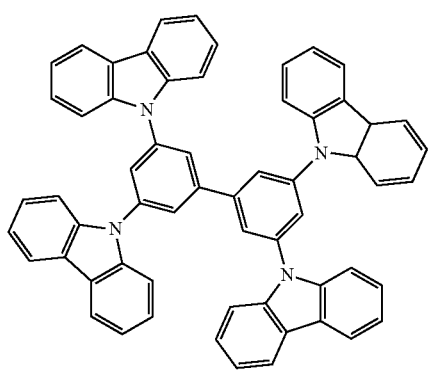

a-21
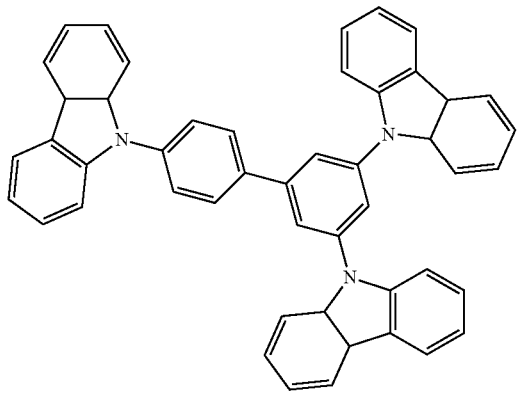
a-22
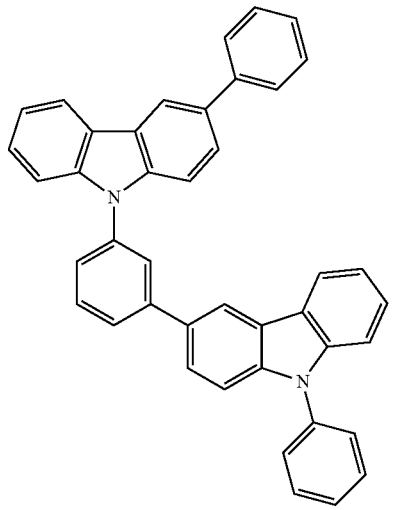
a-23
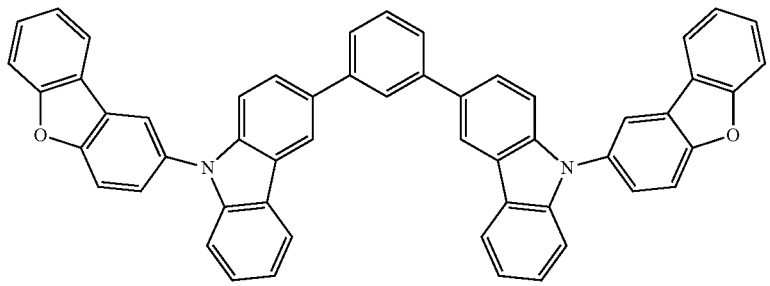
a-24
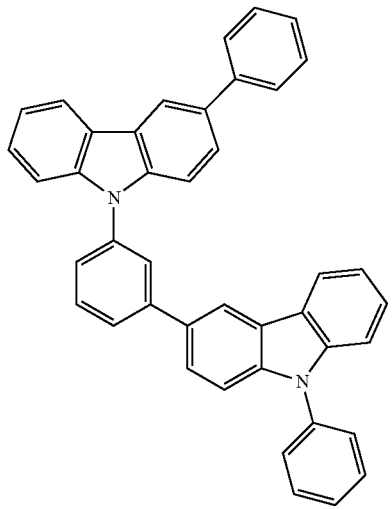

[Chemical Formula 12]
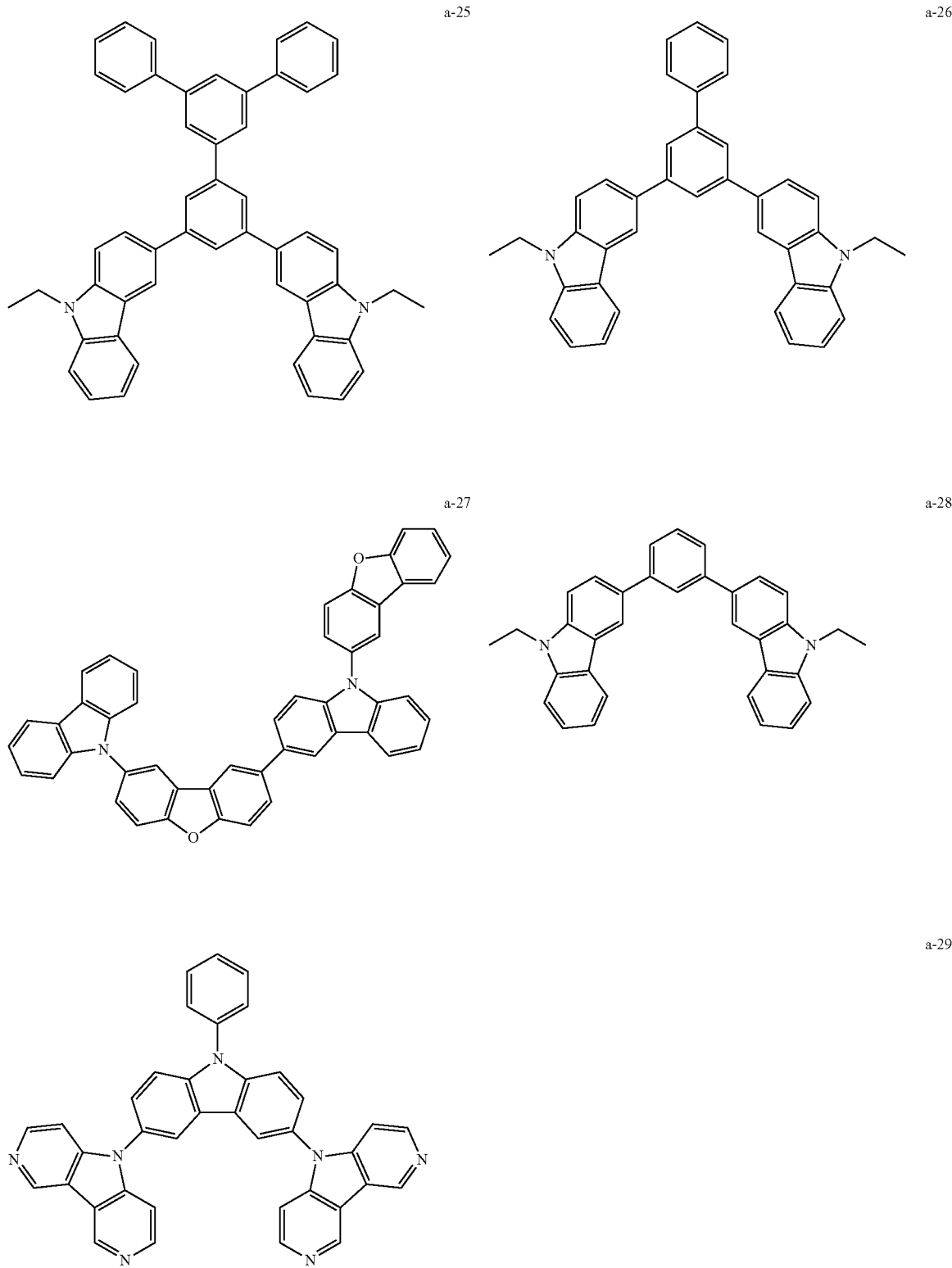

[Chemical Formula 13]
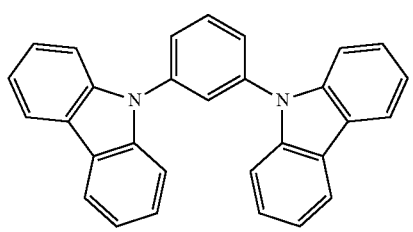
a-30
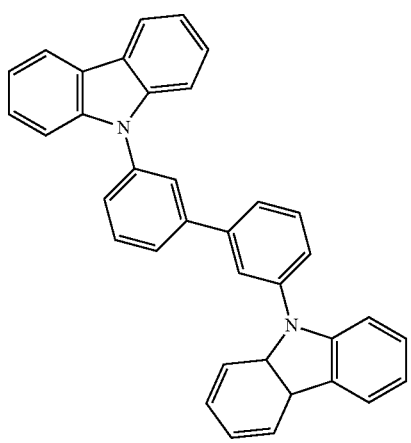
a-31
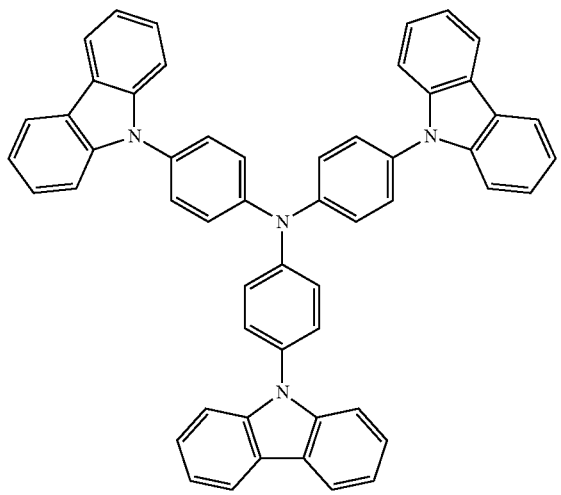
a-32
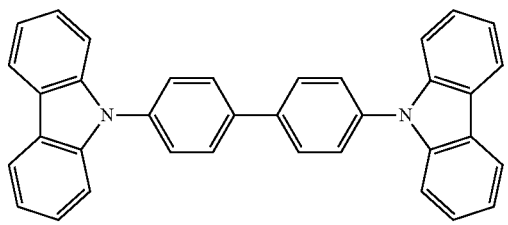
a-33
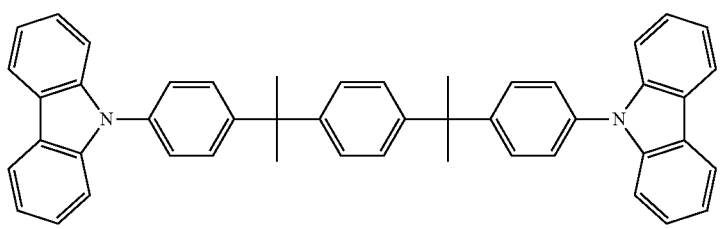
a-34
[Chemical Formula 14]
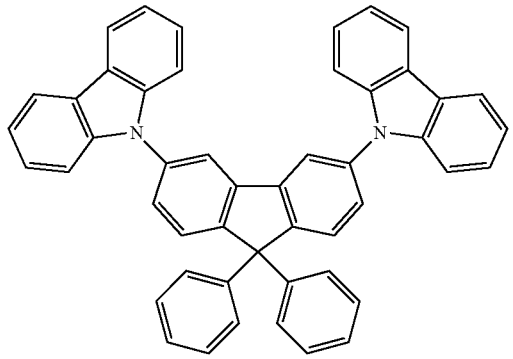
a-35
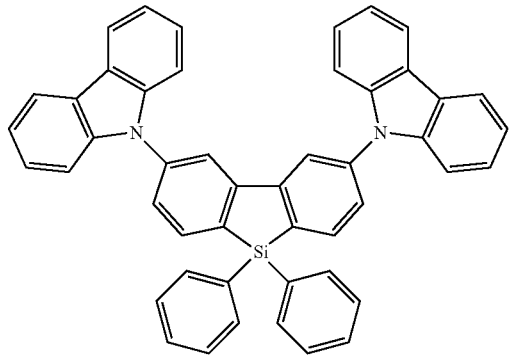
a-36

[Chemical Formula 15]

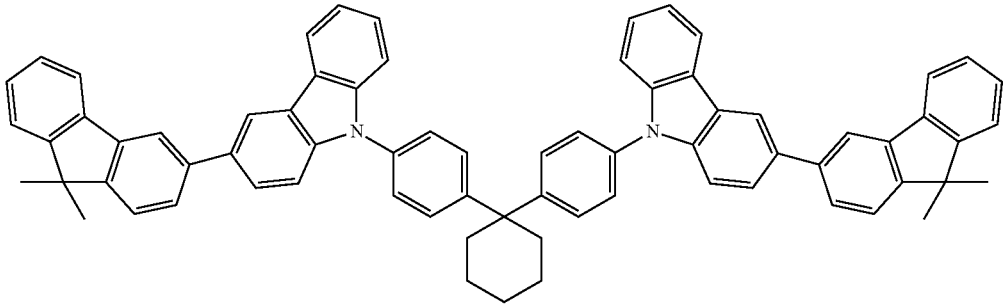

a-37

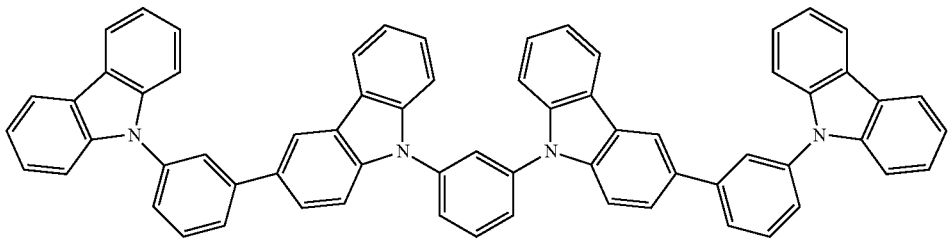

a-38

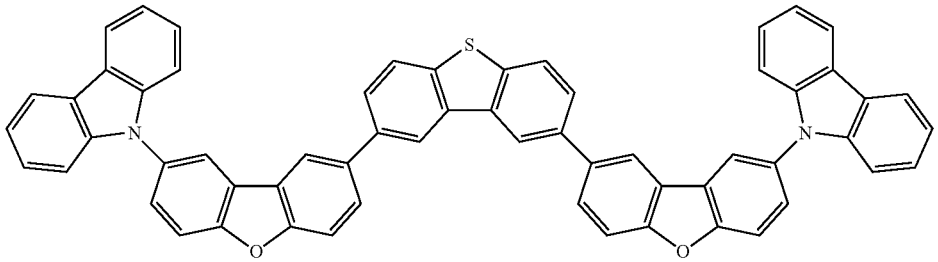

a-39

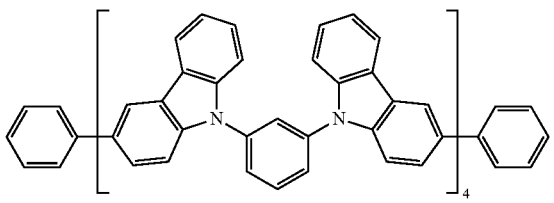

a-40

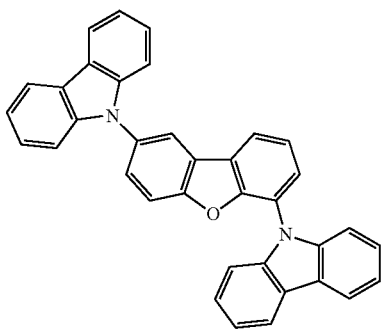

a-41

(4.2) Quantum Dot Material

The light-emitting layer 5 of the electroluminescence element 100 according to the present invention contains a quantum dot material 11, that is, the light-emitting layer 5 is doped with the quantum dot material 11.

The quantum dot material refers to microparticles of a crystalline semiconductor material that have a particle size of about several nanometers to several tens of nanometers and a quantum dot effect that will be described below.

It is to be noted that the particle size of the quantum dot material is not particularly limited as long as the quantum dot material satisfies "particle size distribution" that will be described later, but is, for example, 1 to 20 nm, preferably 1 to 10 nm.

When Planck s constant is defined as "h", electron effective mass is defined as "m", and the radius of the micropar-ticles is defined as "R", the energy level E of the micropar-ticles is generally represented by the following formula (I).

$$E \propto h^2/mR^2 \qquad (I)$$

As shown by the formula (I), the band gap of the microparticles increases in proportion to "$R^{-2}$" so that a so-called quantum dot effect is obtained. The band gap value of quantum dots can be controlled by controlling or regu-lating the particle size of the quantum dots. That is, the control or regulation of the particle size of the microparticles allows the microparticles to have diversity that ordinary atoms do not have. Therefore, excitation of quantum dots with light or application of voltage to an electrolumines-cence element containing quantum dots allows electrons and holes to be confined in the quantum dots and recombined so that electrical energy can be converted into light with a desired wavelength to emit the light. Such a light-emitting quantum dot material is also referred to as quantum dot light-emitting material.

The amount of the quantum dot material to be added is preferably 0.01 to 50 mass %, more preferably 0.05 to 25 mass %, most preferably 0.1 to 20 mass % per 100 parts by mass of all the components of a layer to which the quantum dot material is added. If the concentration of the quantum dot material is lower than the above lower limit, luminance efficiency is not sufficient and emission of white light excellent in color rendering properties cannot be achieved. If the concentration of the quantum dot material exceeds the above upper limit, adjacent quantum dot particles are too close to each other to obtain a sufficient quantum size effect.

Examples of the constituent material of the quantum dot material include: simple substances of Group 14 elements in the periodic table such as carbon, silicon, germanium, and tin; simple substance of Group 15 elements in the periodic table such as phosphorus (black phosphorus); simple substances of Group 16 elements in the periodic table such as selenium and tellurium; compounds composed of two or more Group 14 elements in the periodic table such as silicon carbide (SiC); compounds composed of a Group 14 element in the periodic table and a Group 16 element in the periodic table such as tin(IV) oxide ($SnO_2$), tin(II, IV) sulfide (Sn(II)Sn(IV)$S_3$), tin(IV) sulfide ($SnS_2$), tin(II) sulfide (SnS), tin(II) selenide (SnSe), tin(II) telluride (SnTe), lead(II) sulfide (PbS), lead(II) selenide (PbSe), and lead(II) telluride (PbTe); compounds composed of a Group 13 element in the periodic table and a Group 15 element in the periodic table (or III-V Group compound semiconductors) such as boron nitride (BN), boron phosphide (BP), boron arsenide (BAs), aluminum nitride (AlN), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs), and indium antimonide (InSb); compounds composed of a Group 13 element in the periodic table and a Group 16 element in the periodic table such as aluminum sulfide ($Al_2S_3$), aluminum selenide ($Al_2Se_3$), gallium sulfide ($Ga_2S_3$), gallium selenide ($Ga_2Se_3$), gallium telluride ($Ga_2Te_3$), indium oxide ($In_2O_3$), indium sulfide ($In_2S_3$), indium selenide ($In_2Se_3$), and indium telluride ($In_2Te_3$); compounds composed of a Group 13 element in the periodic table and a Group 17 element in the periodic table such as thallium(I) chloride (TlCl), thallium(I) bromide (TlBr), and thallium(I) iodide (TlI); compounds composed of a Group 12 element in the periodic table and a Group 16 element in the periodic table (or II-VI compound semiconductors) such as zinc oxide (ZnO), zinc sulfide (ZnS), zinc selenide (ZnSe), zinc telluride (ZnTe), cadmium oxide (CdO), cadmium sulfide (CdS), cadmium selenide (CdSe), cadmium tellurium (CdTe), mercury sulfide (HgS), mercury selenide (HgSe), and mercury telluride (HgTe); compounds composed of a Group 15 element in the periodic table and a Group 16 element in the periodic table such as arsenic(III) sulfide ($As_2S_3$), arsenic(III) selenide ($As_2Se_3$), arsenic(III) telluride ($As_2Te_3$), antimony(III) sulfide ($Sb_2S_3$), antimony(III) selenide ($Sb_2Se_3$), antimony(III) telluride ($Sb_2Te_3$), bismuth(III) sulfide ($Bi_2S_3$), bismuth(III) selenide ($Bi_2Se_3$), and bismuth(III) telluride ($Bi_2Te_3$); compounds composed of a Group 11 element in the periodic table and a Group 16 element in the periodic table such as copper(I) oxide ($Cu_2O$) and copper(I) selenide ($Cu_2Se$); compounds composed of a Group 11 element in the periodic table and a Group 17 element in the periodic table such as copper(I) chloride (CuCl), copper(I) bromide (CuBr), copper(I) iodide (CuI), silver chloride (AgCl), and silver bromide (AgBr); compounds composed of a Group 10 element in the periodic table and a Group 16 element in the periodic table such as nickel(II) oxide (NiO); compounds composed of a Group 9 element in the periodic table and a Group 16 element in the periodic table such as cobalt(II) oxide (CoO) and cobalt(II) sulfide (CoS); compounds composed of a Group 8 element in the periodic table and a Group 16 element in the periodic table such as triiron tetraoxide ($Fe_3O_4$) and iron(II) sulfide (FeS); compounds composed of a Group 7 element in the periodic table and a Group 16 element in the periodic table such as manganese(II) oxide (MnO); compounds composed of a Group 6 element in the periodic table and a Group 16 element in the periodic table such as molybdenum(IV) sulfide ($MoS_2$) and tangsten(IV) oxide ($WO_2$); compounds composed of a Group 5 element in the periodic table and a Group 16 element in the periodic table such as vanadium(II) oxide (VO), vanadium(IV) oxide ($VO_2$), and tantalum(V) oxide ($Ta_2O_5$); compounds composed of a Group 4 element in the periodic table and a Group 16 element in the periodic table such as titanium oxide (e.g., $TiO_2$, $Ti_2O_5$, $Ti_2O_3$, $Ti_5O_9$); compounds composed of a Group 2 element in the periodic table and a Group 16 element in the periodic table such as magnesium sulfide (MgS) and magnesium selenide (MgSe); chalcogen spinels such as cadmium(II) chromium(III) oxide ($CdCr_2O_4$), cadmium(II) chromium(III) selenide ($CdCr_2Se_4$), copper(II) chromium(III) sulfide ($CuCr_2S_4$), and mercury(II) chromium(III) selenide ($HgCr_2Se_4$); and barium titanate ($BaTiO_3$). Among them, preferred examples are compounds composed of a Group 14 element in the periodic table and a Group 16 element in the periodic table such as $SnS_2$, SnS, SnSe, SnTe, PbS, PbSe, and PbTe, III-V Group compound semiconductors such as GaN, GaP, GaAs, GaSb, InN, InP, InAs, and InSb, compounds composed of a Group 13 element in the periodic table and a Group 16 element in the periodic table such as $Ga_2O_3$, $Ga_2S_3$, $Ga_2Se_3$, $Ga_2Te_3$, $In_2O_3$, $In_2S_3$, $In_2Se_3$, and $In_2Te_3$, II-VI Group compound semiconductors such as ZnO, ZnS, ZnSe, ZnTe, CdO, CdS, CdSe, CdTe, HgO, HgS, HgSe, and HgTe, compounds composed of a Group 15 element in the periodic table and a Group 16 element in the periodic table such as $As_2O_3$, $As_2S_3$, $As_2Se_3$, $As_2Te_3$, $Sb_2O_3$, $Sb_2S_3$, $Sb_2Se_3$, $Sb_2Te_3$, $Bi_2O_3$, $Bi_2S_3$, $Bi_2Se_3$, and $Bi_2Te_3$, and compounds composed of a Group 2 element in the periodic table and a Group 16 element in the periodic table such as MgS and MgSe, and more preferred examples are Si, Ge, GaN, GaP, InN, InP, $Ga_2O_3$, $Ga_2S_3$, $In_2O_3$, $In_2S_3$, ZnO, ZnS, CdO, and CdS. These substances are advantageous in producing a light-emitting element because they contain no electronegative element having high toxicity and are therefore excellent in prevention of environmental pollution and safety for living things and because a pure spectrum can stably be obtained in a visible light region. Among these materials, CdSe, ZnSe, and CdS are preferred from the viewpoint of stability of light emission. From the viewpoint of luminous efficacy, high refractive index, safety, and cost efficiency, quantum dots of ZnO or ZnS are preferred. Further, the above materials may be used singly or in combination of two or more of them.

It is to be noted that the above-described quantum dot material may be doped with minute amounts of various elements as impurities, if necessary. Addition of such a dopant can significantly improve luminescence properties.

The quantum dot material is preferably one coated with a coating layer of an inert inorganic substance or a coating composed of organic ligands. More specifically, the quantum dot material preferably has a core region (Core) composed of quantum dots and a shell region (Shell) composed of a coating layer of an inert inorganic substance or organic ligands.

The core/shell structure is preferably formed of at least two compounds, and the two or more compounds may form a gradient structure. This makes it possible to effectively prevent aggregation of quantum dots in a coating liquid to improve dispersibility of the quantum dots, and also makes it possible to improve luminance efficiency to prevent color shift caused during continuous driving. Further, stable luminescence properties are achieved by the presence of the shell structure.

Further, when the quantum dot material has the core/shell structure, the quantum dot material can reliably carry a surface modifier, such as one that will be described later, near the surface thereof.

The thickness of the shell is not particularly limited, but is preferably 0.1 to 10 nm, more preferably 0.1 to 5 nm. In general, the color of emitted light can be controlled by the size of quantum dots. When the thickness of the coating is within the above range, the thickness of the shell ranges from a thickness corresponding to some atoms to a thickness corresponding to less than one quantum dot, and therefore quantum dots can be charged at high density so that a sufficient amount of light can be emitted. Further, the presence of the shell can prevent non-radiative electronic energy transfer due to electron trapping in defects or dangling bonds present on the surface of core particles, and therefore a reduction in quantum efficiency can be prevented.

(4.3) Particle Size Distribution of Quantum Dot Material

When a particle size at a cumulative frequency of 10% and a particle size at a cumulative frequency of 90% in the volume-based cumulative particle size distribution of the quantum dot material used in the present invention are defined as d10 (nm) and d90 (nm), respectively, the quantum dot material satisfies d90−d10≥3 nm and preferably satisfies d90−d10≥5 nm.

It is to be noted that the particle size at a cumulative frequency of 10% (d10) specifically refers to a particle size corresponding to a cumulative frequency of 10% in a volume-based cumulative particle size distribution curve (horizontal axis: particle size (μm), vertical axis: cumulative frequency (%)), and the particle size at a cumulative frequency of 90% (d90) specifically refers to a particle size corresponding to a cumulative frequency of 90% in the cumulative particle size distribution curve.

When the quantum dot material satisfies d90−d10≥3 nm, as shown in FIG. 2, the distance between d10 and d90 in the particle size distribution curve (horizontal axis: particle size (μm), vertical axis: existence ratio (%)) of the quantum dot material is large to some extent as shown in FIGS. 2A, 2B, 2C, and 2D.

Figure 2A:
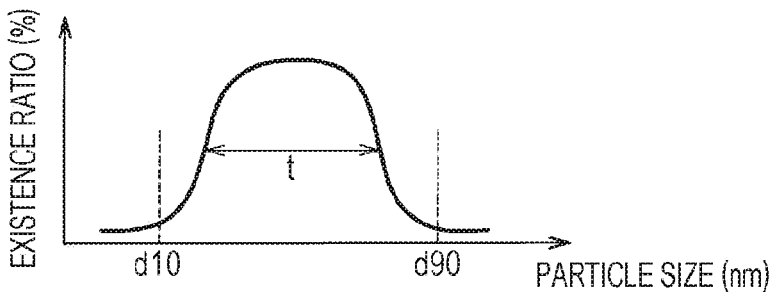
FIGS. 2A to 2E are graphs of the particle size distribution of quantum dot materials used in electroluminescence elements according to embodiments of the present invention.
Figure 2B:
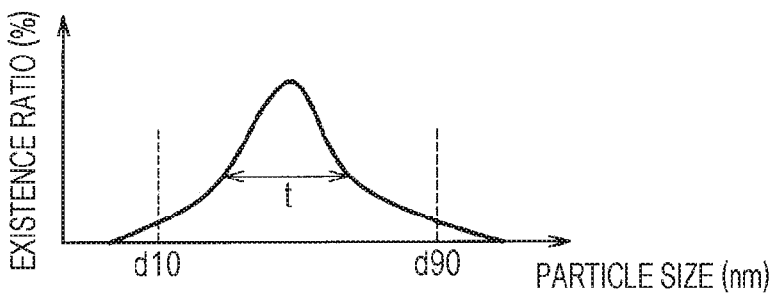
Figure 2C:
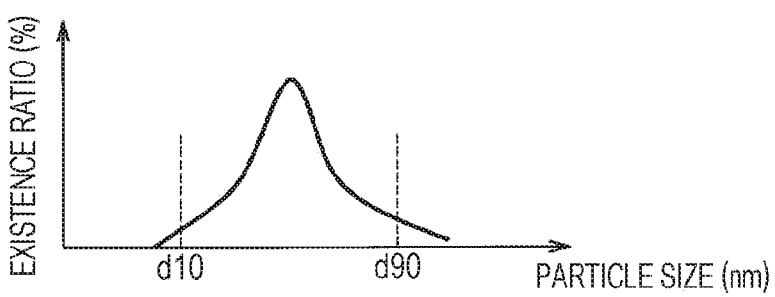
Figure 2D:
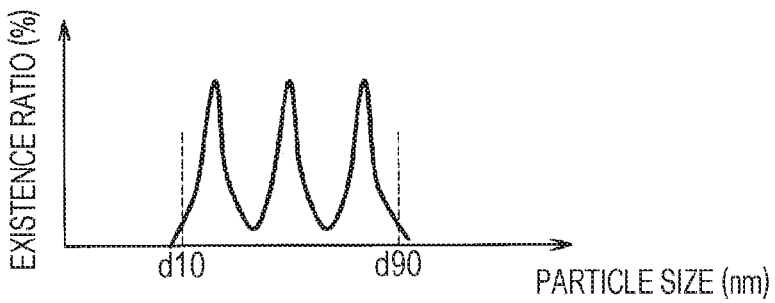
Figure 2E:
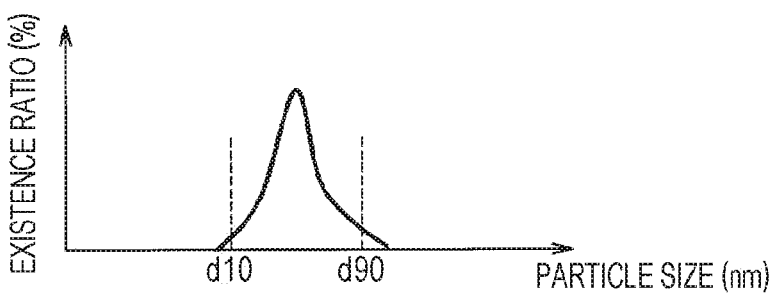

When the quantum dot material satisfies d90−d10≥5 nm, the distance between d90 and d10 is significantly large as shown in FIGS. 2A and 2B.

Therefore, the quantum dot material used in the present invention is not a quantum dot material having a uniform particle size. That is, the light-emitting layer contains quantum dot materials different in particle size, that is, contains quantum dot materials different in luminescence peak.

When the light-emitting layer contains quantum dot materials different in luminescence peak, the electroluminescence element can emit white light excellent in color rendering properties (white light close to natural light) due to its broad emission spectrum.

Further, when the half width of maximum peak of the volume-based particle size distribution of the quantum dot material used in the present invention is defined as t (nm), the quantum dot material preferably satisfies t/(d90−d10)>0.5.

It is to be noted that the half width (t) is an indicator of the extent of a bell-shaped function. More specifically, the half width (t) is the width (full width at half maximum) of the volume-based particle size distribution curve, such as one shown in FIG. 2, measured at the half of the maximum peak value of the existence ratio.

When the quantum dot material satisfies t/(d90−d10)>0.5, as shown in FIG. 2, the half width (t) is larger than the half of the distance between d90 and d10 (d90−d10) in the particle size distribution curve of the quantum dot material as shown in FIG. 2A.

That is, the quantum dot material used in the present invention preferably has a bell-shaped particle size distribution curve that is not sharp but gentle such as one having an almost trapezoidal shape shown in FIG. 2A.

When the quantum dot material has a gentle bell-shaped (almost trapezoidal) particle size distribution curve, the electroluminescence element can emit white light very excellent in color rendering properties (white light close to natural light) due to its broader emission spectrum.

It is to be noted that one light-emitting layer is provided, the particle size distribution of the quantum dot material in the one light-emitting layer preferably satisfies the above-described requirement for the particle size distribution of the quantum dot material. However, when two or more light-emitting layers are provided, the sum of all the quantum dot materials in the light-emitting layers shall satisfy the above-described requirement for the particle size distribution of the quantum dot material.

The volume-based cumulative particle size distribution curve or the particle size distribution curve and the average particle size can be determined by a known method.

Examples of the known method include: a method in which quantum dot particles are observed with a transmission electron microscope (TEM) to determine a particle size distribution, and a number-average particle diameter is determined from the particle size distribution; a method in which the particle size distribution of quantum dots is determined by dynamic light scattering, and a number-average particle diameter is determined from the particle size distribution; and a method in which the particle size distribution of quantum dots is derived from a spectrum obtained by X-ray small-angle scattering by simulated calculation.

(4.4) Functional Surface Modifier

In a coating liquid, quantum dots are preferably modified with a surface modifier attached near the surface thereof. This makes it possible to achieve particularly excellent dispersibility of the quantum dots in the coating liquid. Further, attachment of a surface modifier to the surface of quantum dots at the time of production of the quantum dots makes it possible to form particularly excellent quantum dots having high sphericity and narrow particle size distribution.

Such a functional surface modifier may be directly attached to the core surface of quantum dots or may be attached via the shell (i.e., the surface modifier is directly attached to the shell without contact with the quantum dot core).

Examples of the surface modifier include: polyoxyethylene alkyl ethers such as polyoxyethylene lauryl ether, polyoxyethylene stearyl ether, and polyoxyethylene oleyl ether;

trialkylphosphines such as tripropylphosphine, tributylphosphine, trihexylphosphine, and trioctylphosphine; polyoxyethylene alkyl phenyl ethers such as polyoxyethylene n-octyl phenyl ether and polyoxyethylene n-nonyl phenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organonitrogen compounds such as nitrogen-containing aromatic compounds such as pyridine, lutidine, collidine, and quinoline; aminoalkanes such as hexylamine, octylamine, decylamine, dodecylamine, tetradecylamine, hexadecylamine, and octadecylamine; dialkyl sulfides such as dibutyl sulfide; dialkyl sulfoxides such as dimethyl sulfoxide and dibutyl sulfoxide; organosulfur compounds such as sulfur-containing aromatic compounds such as thiophene; higher fatty acids such as palmitic acid, stearic acid, and oleic acid; alcohols; sorbitan fatty acid esters; fatty acid-modified polyesters; tertiary amine-modified polyurethanes; and polyethylene imines. When quantum dots are prepared by a method that will be described later, the surface modifier is preferably a substance that is coordinated to microparticles and stabilized in a high temperature liquid phase. More specifically, trialkyl phosphines, organophosphorus compounds, amino alkanes, tertiary amines, organonitrogen compounds, dialkyl sulfides, dialkyl sulfoxides, organosulfur compounds, higher fatty acids, and alcohols are preferred. The use of such a surface modifier makes it possible to provide quantum dots that are particularly excellent in dispersibility in a coating liquid. Further, it is possible to produce quantum dots having higher sphericity and sharper particle size distribution.

(4.5) Method for Producing Quantum Dot Material

The quantum dot material can be produced by any one of the following conventional methods for forming a quantum dot material, but a method for producing the quantum dot material is not limited thereto and may be any known method.

Examples of a process performed under high vacuum include molecular beam epitaxy and CVD. Examples of a liquid-phase production method include a reverse micelle method in which an aqueous raw material solution is allowed to be present as reverse micelles in a non-polar organic solvent such as an alkane, e.g., n-heptane, n-octane, or isooctane or an aromatic hydrocarbon, e.g., benzene, toluene, or xylene to cause crystal growth in this reverse micelle phase; a hot soap method in which a thermally-degradable raw material is injected into a high-temperature liquid-phase organic medium to cause crystal growth; a solution reaction method in which an acid-base reaction is used as driving force to cause crystal growth at a relatively low temperature as in the case of a hot soap method; and a radio-frequency sputtering method.

Among them, a radio-frequency sputtering method is particularly preferably used, because the particle size of the quantum dot material can be relatively easily controlled, that is, the particle size of the quantum dot material can be controlled so that the quantum dot material has a desired particle size distribution.

More specifically, the quantum dot material can be produced through the following production steps.

Step (1): An amorphous silicon oxide thin film is formed on a substrate by radio-frequency sputtering using silicon and silica as target materials.

Step (2): The amorphous silicon oxide thin film is subjected to heat treatment to form a quantum dot material (core) in the amorphous silicon oxide thin film.

Step (3): After the heat treatment, the amorphous silicon oxide thin film is treated with hydrofluoric acid to expose the quantum dot material. The particle size of the quantum dot material can be controlled by the conditions of the sputtering and heat treatment.

Step (4): The substrate having the exposed quantum dot material is immersed in a solvent to release the quantum dot material from the substrate to obtain a liquid in which the quantum dot material is dispersed.

Step (5): The surface of the quantum dot material is naturally oxidized in an oxygen atmosphere or thermally oxidized by heating to form a shell layer made of silicon oxide around the core.

Step (6): The quantum dot material is reacted in hydrogen peroxide water to hydroxylate a crystal surface. The hydroxylation allows a reaction with a silane coupling agent or the like to easily proceed.

Step (7): The hydroxylated quantum dot material is washed with hot water.

Step (8): The surface of the quantum dot material is modified with a surface modifier, if necessary.

It is to be noted that the requirement for the particle size distribution of the quantum dot material used in the present invention is preferably satisfied by controlling treatment performed in Step (1) such as radio-frequency sputtering, but may be satisfied by combining two or more quantum dot materials different in particle size.

<Positive Electrode 2>

The positive electrode constituting the electroluminescence element is preferably made of an electrode material, such as a metal, an alloy, an electroconductive compound, or a mixture of two or more of them, that has a high work function (4 eV or more). Specific examples of such an electrode material include metals such as Au and conductive transparent materials such as CuI, indium tin oxide (ITO), $SnO_2$, and ZnO. Alternatively, an amorphous material, such as IDIXO ($In_2O_3$—ZnO), capable of forming a transparent conductive film may be used. The positive electrode may be produced by forming such an electrode material into a thin film by a method such as vapor deposition or sputtering and then allowing the thin film to have a desired pattern by photolithography. When the positive electrode does not need to have high pattern accuracy (about 100 m or more), the pattern may be formed using a mask having a desired shape during vapor deposition or sputtering of the electrode material. Alternatively, when a coatable material such as an organic conductive compound is used, a wet film-forming method such as printing or coating may be used. When emitted light is extracted through the positive electrode, the positive electrode preferably has a transmittance of larger than 10%. The sheet resistance of the positive electrode is preferably several hundred ohms per square or less. Depending on the material used, the thickness of the film is usually selected in the range of 10 to 1000 nm, preferably in the range of 10 to 200 nm.

<Negative Electrode 8>

On the other hand, the negative electrode is made of an electrode material, such as a metal (referred to as electron injectable metal), an alloy, an electroconductive compound, or a mixture of two or more of them, that has a low work function (4 eV or less). Specific examples of such an electrode material include sodium, sodium-potassium alloys, magnesium, lithium, magnesium/copper mixtures, magnesium/silver mixtures, magnesium/aluminum mixtures, magnesium/indium mixtures, aluminum/aluminum oxide ($Al_2O_3$) mixtures, indium, lithium/aluminum mixtures, and rare-earth metals. Among them, from the viewpoint of electron injectability and resistance to oxidation, mixtures of an electron injectable metal and a second metal that is a stable metal having a higher work function than the electron injectable metal are preferred, and examples thereof include magnesium/silver mixtures, magnesium/aluminum mixtures, magnesium/indium mixtures, aluminum/aluminum oxide ($Al_2O_3$) mixtures, lithium/aluminum mixtures, and aluminum. The negative electrode can be produced by forming such an electrode material into a thin film by a method such as vapor deposition or sputtering. The sheet resistance of the negative electrode is preferably several hundred ohms per square or less. The thickness of the film is usually selected in the range of 10 nm to 5 μm, preferably in the range of 50 to 200 nm. It is to be noted that in order to transmit emitted light, one of the positive electrode and the negative electrode of the electroluminescence element is preferably transparent or translucent, which is advantageous in that the luminance of the emitted light is improved.

A transparent or translucent negative electrode can be produced by forming the above metal into a film having a thickness of 1 to 20 nm as a negative electrode and then providing thereon the conductive transparent material described above with reference to the positive electrode. This can be applied to production of an electroluminescence element whose positive electrode and negative electrode both have permeability.

<Substrate 1>

A substrate (hereinafter, also referred to as base, substrate, base material, support, or support substrate) that can be used in the electroluminescence element according to the present invention may be made of any material such as glass or plastic, and may be either transparent or opaque. When light is extracted from the substrate side, the substrate is preferably transparent. Preferred examples of such a transparent substrate include glass, quartz, and transparent resin films. A flexible substrate is preferable to a rigid substrate from the viewpoint of high-temperature storage stability and the effect of reducing chromaticity variation. Therefore, the substrate is particularly preferably a flexible resin film capable of imparting flexibility to the electroluminescence element.

Examples of such a resin film include: polyesters such as polyethylene terephthalate (PET) and polyethylene naphthalate (PEN); polyethylene; polypropylene; cellophane; cellulose esters or derivatives thereof such as cellulose diacetate, cellulose triacetate, cellulose acetate butyrate, cellulose acetate propionate (CAP), cellulose acetate phthalate (TAC), and cellulose nitrate; polyvinylidene chloride; polyvinyl alcohol; polyethylene vinyl alcohol; syndiotactic polystyrene; polycarbonate; norbornene resins; polymethyl pentene; polyether ketone; polyimide; polyether sulfone (PES); polyphenylene sulfide; polysulfones; polyether imide; polyether ketone imide; polyamide; fluorocarbon resins; nylon; polymethyl methacrylate; acrylics or polyarylates; and cycloolefin-based resins such as ARTON (trade name, manufactured by JSR Corporation) and APEL (trade name, manufactured by Mitsui Chemicals, Inc.).

On the surface of the resin film, a coating film of an inorganic or organic material or a hybrid coating film of inorganic and organic materials may be formed. The coating film is preferably a barrier film whose water vapor transmission rate (25±0.5° C., relative humidity (90±2)% RH) measured by a method based on JIS K 7129-1992 is 0.01 g/($m^2$·24 h) or less, and is more preferably a high barrier film whose oxygen transmission rate measured by a method based on JIS K 7126-1987 is $10^{-3}$ $cm^3$/($m^2$·24 h·atm) or less and whose water vapor transmission rate is $10^{-3}$ g/($m^2$·24 h) or less. The water vapor transmission rate is more preferably $10^{-5}$ g/($m^2$·24 h) or less.

The barrier film may be made of any material that has the function of preventing the entry of the cause of deterioration of the electroluminescence element, such as moisture or oxygen. Examples of such a material include silicon oxide, silicon dioxide, and silicon nitride. Further, in order to improve the brittleness of the film, the film more preferably has a laminate structure including a layer made of such an inorganic material and a layer made of an organic material. The inorganic layer and the organic layer may be laminated in any order, but are preferably laminated alternately two or more times.

A method for forming the barrier film is not particularly limited, and examples thereof include vacuum deposition, sputtering, reactive sputtering, molecular beam epitaxy, a cluster ion beam technique, ion plating, plasma polymerization, atmospheric-pressure plasma polymerization, plasma CVD, laser CVD, thermal CVD, and coating. Particularly preferably, the barrier film is formed by atmospheric-pressure plasma polymerization such as one described in JP 2004-68143 A.

Examples of an opaque substrate include metal plates or films such as aluminum or stainless steel, opaque resin substrates, and ceramic substrates.

The light-extraction efficiency at room temperature of the electroluminescence element according to the present invention is preferably 1% or more, more preferably 5% or more. Here, external quantum efficiency (%) is expressed by the following equation:

External quantum efficiency (%)=number of photons emitted out of electroluminescence element/number of electrons passing through electroluminescence element 100.

<Sealing (Sealing Adhesive 9 and Sealing Member 10)>

An example of a sealing means applicable to the electroluminescence element according to the present invention is bonding of a sealing member, electrodes, and a substrate with an adhesive.

The sealing member may be provided so as to cover the display region of the electroluminescence element, and may be either a concave plate or a flat shape. It does not matter whether the sealing member is transparent or electrically insulating.

Specific examples of the sealing member include a glass plate, a polymer plate or film, and a metal plate or film. Specific examples of the glass plate include soda-lime glass, barium-strontium-containing glass, lead glass, aluminosilicate glass, borosilicate glass, barium borosilicate glass, and quartz. Examples of the polymer plate include polycarbonate, acrylic, polyethylene terephthalate, polyethersulfide, and polysulfone. The metal plate is made of at least one metal selected from the group consisting of stainless steel, iron, copper, aluminum, magnesium, nickel, zinc, chromium, titanium, molybdenum, silicon, germanium, and tantalum or an alloy of two or more of them.

In the present invention, a polymer film or a metal film can be preferably used because the electroluminescence element can be made thin. The polymer film preferably has an oxygen transmission rate of $1\times10^{-3}$ $cm^3$/($m^2$·24 h·atm) or less as measured by a method based on JIS K 7126-1987 and a water vapor transmission rate (25±0.5° C., relative humidity (90±2)% RH) of $1\times10^{-3}$ g/($m^2$·24 h) or less as measured by a method based on JIS K 7129-1992.

The sealing member may be processed to have a concave shape by, for example, sandblasting or chemical etching.

Specific examples of the adhesive include: photo-curable and thermosetting adhesives having a reactive vinyl group such as acrylic acid-based oligomers and methacrylic acid-based oligomers; and moisture-curable adhesives such as 2-cyanoacrylates. Other examples of the adhesive include: thermosetting and chemically-curable adhesives (two-part adhesives) such as epoxy-based adhesives; hot-melt adhesives such as polyamides, polyesters, and polyolefins; and cationic UV-curable epoxy resin adhesives.

It is to be noted that the adhesive is preferably curable for bonding at a temperature of room temperature to 80° C., because there is a case where the electroluminescence element is deteriorated by heat treatment. Further, the adhesive may contain a desiccant dispersed therein. The adhesive may be applied onto a portion to be sealed with a commercially-available dispenser or by printing such as screen printing.

A layer of an inorganic or organic material may be appropriately formed as a sealing film on the outside of the electrode opposed to the substrate across the functional layer(s) so that the sealing film covers the electrode and the functional layer(s) so as to be in contact with the substrate. In this case, the film may be made of a material having the function of preventing the entry of the cause of deterioration of the electroluminescence element, such as moisture or oxygen, and examples of such a material include silicon oxide, silicon dioxide, and silicon nitride. Further, in order to improve the brittleness of the film, the film more preferably has a laminate structure including a layer made of such an inorganic material and a layer made of an organic material. A method for forming the film is not particularly limited, and examples thereof include vacuum deposition, sputtering, reactive sputtering, molecular beam epitaxy, cluster ion beam technique, ion plating, plasma polymerization, atmospheric-pressure plasma polymerization, plasma CVD, laser CVD, thermal CVD, and coating.

A gap between the sealing member and the display region of the electroluminescence element is preferably filled with an inert gas such as nitrogen or argon or an inert liquid such as fluorohydrocarbon or silicone oil for the purpose of forming a gas phase or a liquid phase. Alternatively, the gap may be a vacuum. Alternatively, the gap may be filled with a hygroscopic compound.

Examples of the hygroscopic compound include: metal oxides (e.g., sodium oxide, potassium oxide, calcium oxide, barium oxide, magnesium oxide, and aluminum oxide); sulfates (e.g., sodium sulfate, calcium sulfate, magnesium sulfate, and cobalt sulfate); metal halides (e.g., calcium chloride, magnesium chloride, cesium fluoride, tantalum fluoride, cerium bromide, magnesium bromide, barium iodide, and magnesium iodide); and perchlorates (e.g., barium perchlorate and magnesium perchlorate). Sulfates, metal halides, and perchlorates are preferably anhydrous salts.

Sealing is classified into casing-type sealing (can sealing) and contact-type sealing (solid sealing). From the viewpoint of reducing the thickness of the electroluminescence element, solid sealing is preferred. When the electroluminescence element is required to have flexibility, solid sealing is preferred because the sealing member is also required to have flexibility.

Hereinbelow, a preferred example of the solid sealing will be described.

The sealing adhesive used in the present invention may be, for example, a thermosetting adhesive or a UV-curable resin, but is preferably a thermosetting adhesive such as an epoxy-based resin, an acrylic resin, or a silicone resin, more preferably an epoxy-based thermosetting adhesive resin for its excellent moisture resistance and water resistance and little shrinkage during curing.

The water content of the sealing adhesive used in the present invention is preferably 300 ppm or less, more preferably 0.01 to 200 ppm, most preferably 0.01 to 100 ppm.

In the present invention, the water content may be measured by any method. Examples of the measuring method include a method using a volumetric moisture meter (Karl Fischer), an infrared moisture gauge, or a microwave transmission-type moisture meter, a dry weight method, GC/MS, IR, a method using a DSC (Differential Scanning Calorimeter), and TDS (Thermal Desorption Spectroscopy). Alternatively, an accurate moisture meter, AVM-3000 (manufactured by OMNI-TECH) may be used to measure the water content of a film or a solid film based on an increase in pressure caused by moisture evaporation.

In the present invention, the water content of the sealing adhesive can be adjusted by, for example, changing the time during which the sealing adhesive is placed in a nitrogen atmosphere having a dew point of −80° C. or lower and an oxygen concentration of 0.8 ppm. The sealing adhesive may be dried in a vacuum of 100 Pa or less, and the time during which the sealing adhesive is placed in a vacuum may be changed. The sealing adhesive may be dried alone, or may be placed on the sealing member in advance and then dried.

When contact-type sealing (solid sealing) is performed, for example, a 50 μm-thick PET (polyethylene terephthalate) film having an aluminum foil (30 μm thick) laminated thereon is used as a sealing member. Specifically, contact-type sealing (solid sealing) is performed in the following manner: the sealing adhesive is placed on the aluminum surface of the sealing member in advance by uniformly applying it with a dispenser, and the resin substrate 1 and the sealing member 5 are aligned, pressure-bonded together (0.1 to 3 MPa), and then bonded together at a temperature of 80 to 180° C. to be in close contact with each other.

The heating or pressure-bonding time varies depending on the kind, amount, and area of the adhesive, but temporary bonding may be performed at a pressure of 0.1 to 3 MPa, and the time of thermal curing at a temperature of 80 to 180° C. may be selected in the range of 5 seconds to 10 minutes.

A heated pressure roll is preferably used because pressure-bonding (temporary bonding) and heating can be performed at the same time, and removal of inner gaps can also be performed at the same time.

The adhesive layer can be formed using a dispenser by a method selected depending on the type of material used, and examples of the method include a coating method such as roll coating, spin coating, screen printing, or spray coating and a printing method.

As described above, solid sealing is performed by covering with a cured resin so that there is no space between the sealing member and the substrate of the electroluminescence element.

Examples of the sealing member include: metals such as stainless steel, aluminum, and magnesium alloys; plastics such as polyethylene terephthalate, polycarbonate, polystyrene, nylon, and polyvinyl chloride and composites thereof; and glass. Particularly, when the sealing member is a resin film, a gas barrier layer made of aluminum, aluminum oxide, silicon oxide, or silicon nitride may be laminated on the resin film, if necessary, as in the case of the resin substrate.

The gas barrier layer may be formed on one or both of the surfaces of the sealing member by sputtering or vapor deposition before the sealing member is molded, or may be formed on one or both of the surfaces of the sealing member by the same method after sealing. This gas barrier layer also preferably has an oxygen transmission rate of $1\times10^{-3}$ ml/(m²·24 h·atm) or less and a water vapor transmission rate (25±0.5° C., relative humidity (90±2)% RH) of $1\times10^{-3}$ g/(m²·24 h) or less.

The sealing member may also be, for example, a film having a metal foil of aluminum laminated thereon. The lamination of a polymer film on one of the surfaces of a metal foil can be performed by a method using a commonly-used laminator. Examples of a usable adhesive include polyurethane-based adhesives, polyester-based adhesives, epoxy-based adhesives, and acrylic adhesives. If necessary, a curing agent may be used together. Hot-melt lamination, extrusion lamination, or co-extrusion lamination may be used, but dry lamination is preferably used.

When the metal foil is formed by sputtering or vapor deposition and the polymer film is formed from a flowable electrode material such as a conductive paste, the sealing member may be formed by conversely using the polymer film as a base material and forming the metal foil on the polymer film.

<Protective Film and Protective Plate>

A protective film or a protective plate may be provided on the outside of the sealing film opposed to the substrate across the functional layer(s) in order to enhance the mechanical strength of the electroluminescence element. Particularly, when sealing is performed by a sealing film, the mechanical strength of the sealing film is not always high, and therefore such a protective film or protective plate is preferably provided. Examples of a material that can be used for such a protective film or protective plate include the same glass plate, polymer plate or film, and metal plate or film as used for sealing. However, from the viewpoint of reducing the weight and thickness of the electroluminescence element, a polymer film is preferably used.

In the present invention, a light extraction member is preferably provided between the flexible substrate and the positive electrode or between the flexible substrate and any position on the light emission side.

Examples of the light extraction member include a prism sheet, a lens sheet, and a diffusion sheet. Another example of the light extraction member is a diffraction grating or a diffuse structure that is introduced into an interface where total reflection occurs or any of media.

Generally, in an electroluminescence element that emits light through its substrate, part of light emitted from its light-emitting layer causes total reflection at an interface between the substrate and air, which causes a problem of loss of light. In order to solve such a problem, the surface of the substrate is subjected to prism processing or lens processing, or a prism sheet, a lens sheet, or a diffusion sheet is attached to the surface of the substrate to prevent total reflection to improve light extraction efficiency.

Another known method for improving light extraction efficiency is introduction of a diffraction grating or a diffuse structure into an interface where total reflection occurs or any of media.

<Method for Producing Electroluminescence Element 100>

A method for producing an electroluminescence element including a positive electrode, a hole injection layer, a hole transport layer, a light-emitting layer, an electron transport layer, an electron injection layer, and a negative electrode will be described as one example of a method for producing the electroluminescence element according to the present invention.

First, a thin film made of a desired electrode material, e.g., a positive electrode material is formed on an appropriate base to have a thickness of 1 μm or less, preferably 10 to 200 nm by a thin film-forming method such as vapor deposition or sputtering to prepare a positive electrode.

Then, a hole injection layer, a hole transport layer, a light-emitting layer, an electron transport layer, and an electron injection layer are formed on the positive electrode as functional layers (compound thin films) of electroluminescence element materials.

The functional layers are mainly formed through the steps of:

(i) applying and laminating coating liquids for forming the functional layers on the positive electrode formed on the substrate; and (ii) drying the applied and laminated coating liquids.

In the step (i), as described above, each of the layers can be formed by a vapor deposition method or a wet process (e.g., spin coating, casting, die coating, blade coating, roll coating, ink-jetting, printing, spray coating, curtain coating, LB (Langmuir Blodgett) method). It is preferred that at least a layer containing a quantum dot material is formed by a wet process.

In the present invention, the functional layers other than the hole injection layer are also preferably formed by a wet process, especially a coating method such as spin coating, casting, die coating, blade coating, roll coating, or ink-jetting, because homogeneous films are easily obtained and pin holes are less likely to be formed.

Examples of a liquid medium used to dissolve or disperse the EL material used in the present invention include organic solvents such as ketones, e.g., methyl ethyl ketone and cyclohexanone, fatty acid esters, e.g., ethyl acetate, halogenated hydrocarbons, e.g., dichlorobenzene, aromatic hydrocarbons, e.g., toluene, xylene, mesitylene, and cyclohexylbenzene, aliphatic hydrocarbons, e.g., cyclohexane, decalin, and dodecane, dimethylformamide (DMF), and dimethylsulfoxide (DMSO). The EL material can be dispersed by a dispersion method such as ultrasonic dispersion, high-shear force dispersion, or media dispersion.

The preparation of the coating liquid by dissolving or dispersing the EL material used in the present invention and the application of the coating liquid onto the base material are preferably performed in an inert gas atmosphere. However, such preparation and application do not always need to be performed in an inert gas atmosphere, because some materials can be formed into films in an atmosphere other than an inert gas atmosphere without impairing the performance of the electroluminescence element. This is more preferred in that production costs can be reduced.

In the step (ii), drying of the applied and laminated functional layers is performed.

Here, the drying means that when the solvent content of a film just after application is defined as 100%, the solvent content of the film is reduced to 0.2% or less.

The drying can be performed by any generally-used means such as drying under reduced or increased pressure, thermal drying, air drying, IR drying, or electromagnetic wave drying. Among them, thermal drying is preferred. Most preferably, thermal drying is performed by maintaining a temperature of equal to or higher than the lowest boiling point among the boiling points of solvents used to prepare the coating liquids for forming the functional layers but lower than a temperature higher by 20° C. than the lowest Tg among the Tgs of the functional layer materials (Tg+20° C.). More specifically, in the present invention, the drying is preferably performed by maintaining a temperature of 80° C. or higher but 150° C. or lower, more preferably a temperature of 100° C. or higher but 130° C. or lower.

The applied and laminated coating liquids are preferably dried in an atmosphere whose volume concentration of gas other than an inert gas is 200 ppm or less. Similarly to the preparation and application of coating liquids, in some cases, the drying does not always need to be performed in an inert gas atmosphere. This is more preferred in that production costs can be reduced.

The inert gas is preferably a noble gas such as nitrogen gas or argon gas, most preferably nitrogen gas in terms of production costs.

The application, lamination, and drying of these layers may be performed by either a one-by-one production system or a line production system. Further, the drying may be performed on a transfer line. However, from the viewpoint of productivity, the drying may be performed after stacking or contactless winding into a roll.

After these layers are dried, a thin film made of a negative electrode material is formed thereon by, for example, vapor deposition or sputtering so as to have a thickness of 1 m or less, preferably 50 nm to 200 nm to provide a negative electrode to obtain a desired electroluminescence element.

After the heat treatment, the above-described contact-type sealing is performed or the sealing member, the electrodes, and the substrate are bonded with an adhesive. In this way, an electroluminescence element can be produced.

<Applications>

The electroluminescence element according to the present invention is applicable to display devices, displays, and various light sources.

Examples of the light sources for various purposes include home lighting devices, car lighting devices, backlights for watches, clocks, and liquid crystal devices, advertising displays, traffic lights, and light sources for optical recording media, light sources of electrophotographic copiers, light sources of optical communication processors, light sources of optical sensors, and common home electrical appliances requiring display devices. Particularly, the electroluminescence element is effectively applicable to backlights of liquid crystal displays combined with color filters and light sources for lighting.

If necessary, patterning may be performed by, for example, metal masking or ink-jet printing when a film is formed during production of the electroluminescence element according to the present invention. When patterning is performed, only the electrode may be patterned, the electrode and the light-emitting layer may be patterned, or all the layers of the element may be patterned. The element can be produced by a conventionally-known method.

In the electroluminescence element according to the embodiment of the present invention, the quantum dot material contained in the light-emitting layer satisfies d90–d10≥3 nm. Therefore, the light-emitting layer contains not a quantum dot material having a uniform particle size but quantum dot materials different in particle size, that is, the light-emitting layer contains quantum dot materials different in emission peak. As a result, when the electroluminescence element emits light, the light has a broad emission spectrum and is therefore white light excellent in color rendering properties (white light close to natural light).

Further, the electroluminescence element according to the embodiment of the present invention uses a quantum dot material as a luminescent center (light-emitting material), and therefore has a slower deterioration rate and a longer service life as compared to when a phosphorescence-emitting material is used.

In addition, when the electroluminescence element according to the embodiment of the present invention has one light-emitting layer containing a quantum dot material satisfying d90–d10≥3 nm, the one light-emitting layer can emit white light. In this case, the light-emitting layer can be formed by performing a film-forming operation only once, which makes it possible to simplify a method for producing the electroluminescence element.

It is to be noted that as described above, the electroluminescence element according to the embodiment of the present invention uses a quantum dot material as a luminescent center (light-emitting material) and does not use an organic phosphorescence-emitting dopant. On the other hand, in a technique disclosed in Patent Literature 2, a phosphorescence-emitting dopant is used as a luminescent center (light-emitting material), and a quantum dot material is also used (see claim 1 of Patent Literature 2) to play a role in changing the color of emitted light.

That is, there is a difference in expected role between the quantum dot material used in the electroluminescence element according to the embodiment of the present invention and the quantum dot material used in the technique disclosed in Patent Literature 2, and therefore the present invention and the technique disclosed in Patent Literature 2 are different not only in luminescent center (light-emitting material) but also in luminescence principle itself.

In the electroluminescence element according to the embodiment of the present invention, the quantum dot material contained in the light-emitting layer satisfies d90–d10≥5 nm. Therefore, when the electroluminescence element emits light, the light has a broader emission spectrum and is therefore white light more excellent in color rendering properties.

In the electroluminescence element according to the embodiment of the present invention, the quantum dot material contained in the light-emitting layer satisfies t/(d90–d10)>0.5, and therefore the particle size distribution of the quantum dot material has an almost trapezoidal shape as shown in FIG. 2A. As a result, when the electroluminescence element emits light, the light has a broader emission spectrum and is therefore white light very excellent in color rendering properties.

In the electroluminescence element according to the embodiment of the present invention, the quantum dot material contained in the light-emitting layer includes a core and a shell (core/shell structure), and therefore formation of aggregates can be prevented in the process of laminating the light-emitting layer to prevent the occurrence of self-quenching. As a result, luminous efficacy can be improved, and therefore the effect of prolonging the service life of the light-emitting element can be obtained.

In the electroluminescence element according to the embodiment of the present invention, the quantum dot material contained in the light-emitting layer is surface-modified with the surface modifier, and therefore formation of aggregates can more reliably be prevented in the process of laminating the light-emitting layer to further prevent the occurrence of self-quenching. As a result, luminous efficacy can be improved, and therefore the effect of prolonging the service life of the light-emitting element can more reliably be obtained.

The electroluminescence element according to the embodiment of the present invention has been described above, but may have another conventionally-known component that has not clearly been specified. It is obvious that another conventionally-known component is not particularly limited as long as the electroluminescence element has the effects obtained by the above-described components.

EXAMPLES

Hereinbelow, the electroluminescence element according to the present invention will be described with reference to examples satisfying the requirement of the present invention and comparative examples not satisfying it.

<Preparation of Quantum Dot Materials>

The following quantum dot materials (Core/Shell) were prepared. The quantum dot materials used in samples had such different volume-based particle size distributions as shown in FIGS. 2A to 2E. It is to be noted that the volume-based particle size distribution, d10, and d90 of each of the quantum dot materials were measured by a laser diffraction/scattering particle size distribution analyzer (manufactured by BECKMAN COULTER).

Q1: CdSe/-
Q2: CdSe/ZnO
Q3: CdSSe/ZnS

Thereafter, some of the quantum dot materials were subjected to surface modification with ODS (octadecylsilyl group: C18H37Si) to obtain ODS-modified quantum dot materials.

<Preparation of Samples>

Samples 1 to 16 were prepared in the following manner.

(1) Preparation of Flexible Gas Barrier Film

On the entire surface of a flexible polyethylene naphthalate film (manufactured by Teijin DuPont Films Japan Limited, hereinafter abbreviated as PEN) on which a first electrode was to be formed, an inorganic gas barrier film made of SiOx was continuously formed to have a thickness of 500 nm using an atmospheric-pressure plasma discharger having a structure described in JP 2004-68143 A to prepare a flexible gas barrier film. The flexible gas barrier film had an oxygen transmission rate of 0.001 ml/m²/day or less and a water vapor transmission rate of 0.001 g/m²/day or less.

(2) Formation of First Electrode

An ITO (indium tin oxide) film having a thickness of 120 nm was formed on the prepared flexible gas barrier film by sputtering, and was patterned by photolithography to form a first electrode layer (positive electrode). It is to be noted that the patterning was performed so that an emission area was 50 mm².

(3) Formation of Hole Injection Layer

After the patterning, the ITO substrate was ultrasonically cleaned with isopropyl alcohol, dried with dry nitrogen gas, and cleaned with UV ozone for 5 minutes. On this substrate, a film was formed by spin coating a solution, obtained by diluting poly (3,4-ethylenedioxythiophene)-polystyrene sulfonate (abbreviated as PEDOT/PSS, Baytron P AI 4083 manufactured by Bayer) with pure water to 70%, at 3000 rpm for 30 seconds, and was then dried at 200° C. for 1 hour to provide a hole injection layer having a thickness of 30 nm.

(4) Formation of Hole Transport Layer

This substrate was transferred into a nitrogen atmosphere using nitrogen gas (grade G1), and a film was formed on the substrate by spin coating a solution, obtained by dissolving the exemplary compound (60) (Mw=80,000) as the hole transport material in chlorobenzene at 0.5%, at 1500 rpm for 30 seconds, and was then maintained at 160° C. for 30 minutes to provide a hole transport layer having a thickness of 30 nm.

(5) Formation of Light-Emitting Layer

Then, a film was formed by spin coating a light-emitting layer composition having a composition shown below or a composition obtained by diluting the light-emitting layer composition two-fold with the same solvent at 1500 rpm for 30 seconds, and was then maintained at 120° C. for 30 minutes to provide a light-emitting layer having a thickness of 40 nm.

(5.1) Samples 1 to 3, 5 to 12, and 14

A light-emitting layer composition used for Samples 1 to 3, 5 to 12, and 14 is as follows.

<Light-Emitting Layer Composition>

| | |
|---|---|
| Exemplary Compound a-38 | 14.00 parts by mass |
| Quantum Dot Material (material shown in Table 1) | 0.74 parts by mass |
| Toluene | 2,000 parts by mass |

(5.2) Sample 4

A light-emitting layer composition used for Sample 4 is as follows.

<Light-Emitting Layer Composition>

| | |
|---|---|
| Exemplary Compound a-38 | 14.25 parts by mass |
| Quantum Dot Material (material shown in Table 1: median 2 nm) | 0.20 parts by mass |
| Quantum Dot Material (material shown in Table 1: median 3.5 nm) | 0.20 parts by mass |
| Quantum Dot Material (material shown in Table 1: median 5 nm) | 0.20 parts by mass |
| Toluene | 2,000 parts by mass |

(5.3) Sample 13

A light-emitting layer composition used for Sample 13 is as follows.

<Light-Emitting Layer Composition>

| | |
|---|---|
| Exemplary Compound a-38 | 14.25 parts by mass |
| Exemplary Compound D-66 | 2.45 parts by mass |
| Exemplary Compound D-67 | 0.025 parts by mass |
| Exemplary Compound D-80 | 0.025 parts by mass |
| Quantum Dot Material (material shown in Table 1) | 0.30 parts by mass |
| Toluene | 2,000 parts by mass |

(5.4) Sample 15

Light-emitting layer compositions used for Sample 15 are as follows.

It is to be noted that Sample 15 has three light-emitting layers, and the following light-emitting layer composition 1 is provided on the first electrode side and the following light-emitting layer composition 3 is provided on the second electrode side.

<Light-Emitting Layer Composition 1>

| | |
|---|---|
| Exemplary Compound a-38 | 14.00 parts by mass |
| Quantum Dot Material (material shown in Table 1: median 2 nm) | 0.30 parts by mass |
| Toluene | 2,000 parts by mass |

<Light-Emitting Layer Composition 2>

| | |
|---|---|
| Exemplary Compound a-38 | 14.00 parts by mass |
| Quantum Dot Material (material shown in Table 1: median 3.5 nm) | 0.74 parts by mass |
| Toluene | 2,000 parts by mass |

<Light-Emitting Layer Composition 3>

| | |
|---|---|
| Exemplary Compound a-38 | 14.00 parts by mass |
| Quantum Dot Material (material shown in Table 1: median 5 nm) | 0.74 parts by mass |
| Toluene | 2,000 parts by mass |

(5.5) Sample 16

A light-emitting layer composition used for Sample 16 is as follows.

Light-Emitting Layer Composition

| | |
|---|---|
| Exemplary Compound a-38 | 14.25 parts by mass |
| Exemplary Compound D-66 | 2.45 parts by mass |
| Exemplary Compound D-67 | 0.025 parts by mass |
| Exemplary Compound D-80 | 0.025 parts by mass |
| Toluene | 2,000 parts by mass |

[Chemical Formula 16]

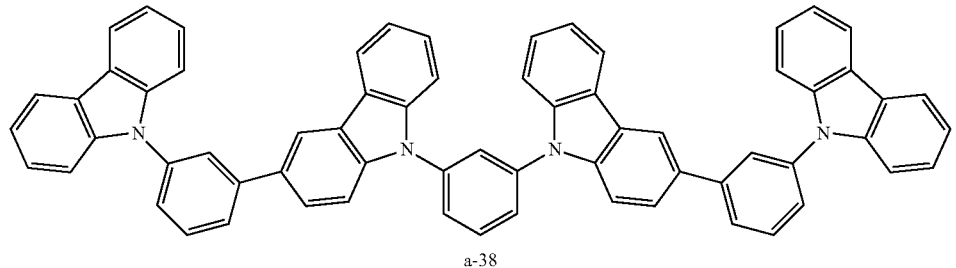

a-38

[Chemical Formula 17]

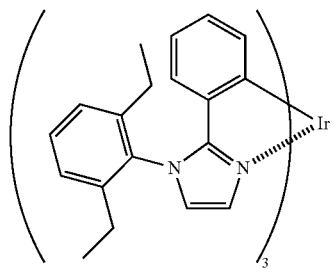

D-66

[Chemical Formula 18]

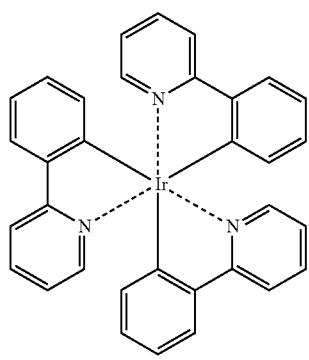

D-67

[Chemical Formula 19]

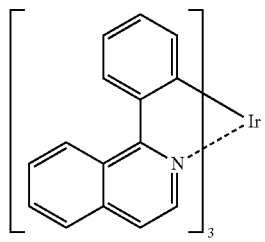

D-80

(6) Formation of Electron Transport Layer

Then, 20 mg of an exemplary compound (compound A) represented by a general formula (A) was dissolved in 4 ml of tetrafluoropropanol (TFPO) to obtain a solution, and a film was formed by spin coating the solution at 1500 rpm for 30 seconds, and was then maintained at 120° C. for 30 minutes to provide an electron transport layer having a thickness of 30 nm.

[Chemica Formula 20]

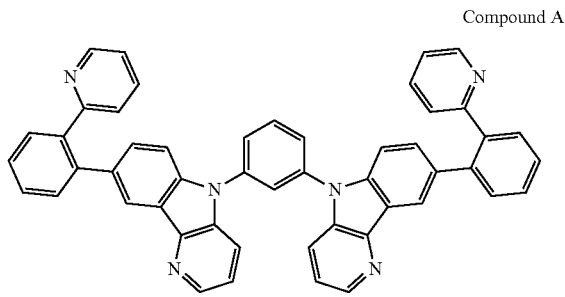

Compound A (7) Formation of Electron Injection Layer and Negative Electrode

Then, the substrate was attached to a vacuum deposition apparatus without exposing to the atmosphere. Further, molybdenum resistance heating boats respectively containing sodium fluoride and potassium fluoride were attached to the vacuum deposition apparatus, and the pressure in a vacuum tank was reduced to $4 \times 10^{-5}$ Pa. Then, the boat was electrically heated to vapor-deposit sodium fluoride on the electron transport layer at 0.02 nm/sec to form a thin film having a thickness of 1 nm, and then potassium fluoride was vapor-deposited on sodium fluoride at 0.02 nm/sec in the same manner to form an electron injection layer having a thickness of 1.5 nm.

Then, aluminum was vapor-deposited to form a negative electrode having a thickness of 100 nm.

(8) Sealing and Production of Electroluminescence Element

Then, a sealing member was bonded using a commercially-available roll laminator to produce Samples 1 to 13 (electroluminescence elements).

It is to be noted that the sealing member used was obtained by laminating a polyethylene terephthalate (PET) film (12 μm thick) on a flexible aluminum foil having a thickness of 30 μm (manufactured by Toyo Aluminum K.K.) with an adhesive for dry lamination (two-component reactive urethane-based adhesive) (thickness of adhesive layer: 1.5 μm).

On the aluminum surface, a thermosetting adhesive as a sealing adhesive was uniformly applied to have a thickness of 20 μm along the adherend (glossy surface) of the aluminum foil with a dispenser, and was dried for 12 hours in a vacuum of 100 Pa or less. Further, the aluminum foil was transferred into a nitrogen atmosphere having a dew point of −80° C. or lower and an oxygen concentration of 0.8 ppm and dried for 12 hours or longer to adjust the water content of the sealing adhesive to 100 ppm or less.

The thermosetting adhesive used was an epoxy-based adhesive obtained by mixing the following (A) to (C):
 (A) bisphenol A diglycidyl ether (DGEBA);
 (B) dicyandiamide (DICY); and
 (C) epoxy adduct-based curing promoter.

The sealing substrate was disposed so as to closely cover a junction between an extraction electrode and an electrode lead in such a form as shown in FIG. 1, and contact-type sealing was performed using a pressure roller at a pressure roller temperature of 120° C., a pressure of 0.5 MPa, and a device speed of 0.3 m/min. In this way, Samples 1 to 13 (electroluminescence elements) were produced.

<Evaluation of Samples>

"Evaluation of Color Rendering Properties", "Evaluation of Service Life as White Light-Emitting Element", and "Evaluation of Luminous Efficacy" were performed in the following manner on Samples 1 to 16 prepared above.

(Evaluation of Color Rendering Properties)

Each of the prepared samples was allowed to emit light at room temperature (about 23 to 25° C.) under a constant luminance condition of 1000 cd/m². The luminance of light emitted from each of the samples was measured with a spectroradiometer CS-2000 (manufactured by Konica Minolta Sensing), and color rendering indexes were determined to calculate an average of color rendering indexes.

It is to be noted that the average of color rendering indexes Ra was calculated based on JIS Z8726-1990.

The evaluation of color rendering properties was made based on the following criteria:
 1: Ra<80
 2: 80≤Ra<84
 3: 84≤Ra<87
 4: 87≤Ra<91
 5: 91≤Ra.

It is to be noted that in the above criteria, 5 was the best result, and "5", "4", "3", and "2" were regarded as acceptable.

(Evaluation of Service Life as White Light-Emitting Element)

Each of the prepared samples was wrapped around a cylinder having a radius of 5 cm, and then the bent sample was continuously driven. The luminance of emitted light was measured with a spectroradiometer CS-2000 (manufactured by Konica Minolta Sensing) to determine the time until the measured luminance was decreased by half (LT50). The continuous driving was performed at such a current value that the luminance at the start of continuous driving was 4000 cd/m².

It is to be noted that the LT50 of Sample 16 (Reference Example) was used as a reference value (reference LT50 value), and the evaluation was made based on the ratio of LT50 of each of the samples to the reference value (=LT50/reference LT50 value).

The evaluation of service life as a white light-emitting element was made based on the following criteria:
 1: LT50/reference LT50 value<1.0
 2: 1.0≤LT50/reference LT50 value<1.5
 3: 1.5≤LT50/reference LT50 value<2.0
 4: 2.0≤LT50/reference LT50 value<2.5
 5: 2.5≤LT50/reference LT50 value It is to be noted that in the above criteria, "5" was the best result, and "5", "4", and "3" were regarded as acceptable. When there was a sample that did not emit white light, its service life could not be evaluated and therefore expressed as "-" (no result).

(Evaluation of Luminous Efficacy)

Each of the prepared samples was allows to emit light at room temperature (about 23 to 25° C.) under a constant luminance condition of 1000 cd/m². The luminance of light emitted from each of the samples was measured with a spectroradiometer CS-2000 (manufactured by Konica Minolta Sensing). The external quantum efficiency (EQE) of each of the samples at a luminance of 1000 cd/m² was measured. It is to be noted that when the value of external quantum efficiency is larger, luminous efficacy can be regarded as higher.

The evaluation of luminous efficacy was made based on the following criteria:
1: 0%≤EQE≤3%
2: 3%≤EQE≤5%
3: 5%≤EQE≤8%
4: 8%≤EQE≤12%
5: 12% EQE≤

It is to be noted that in the above criteria, 5 was the best result, and "5", "4", and "3" were regarded as acceptable.

"Sample Structure" and "Sample Evaluation" were shown in the following Table 1. In Table 1, (a) to (e) representing "Shape of Particle Size Distribution" correspond to FIGS. 2A to 2E, and "QDs" is an abbreviation for "quantum dot material" and "P" is an abbreviation for "phosphorescence-emitting material".

<Review of Results>

As can be seen from the results shown in Table 1, Samples 1 to 12 and 15 were regarded as acceptable in all "Evaluation of Color Rendering Properties", "Evaluation of Service Life as White Light-Emitting Element", and "Evaluation of Luminous Efficacy".

Particularly, Samples 5, 6, 7, 8, 11, and 12 satisfying d90−d10≥5 nm were rated as "4" or higher in both Evaluation of Color Rendering Properties and Evaluation of Service Life as White Light-Emitting Element, that is, Samples 5, 6, 7, 8, 11, and 12 were excellent in color rendering properties and service life. Samples 5, 6, 10, and 12 whose quantum dot material was surface modified were rated as "5" in "Evaluation of Service Life as White Light-Emitting Element", that is, Samples 5, 6, 10, and 12 were very excellent in service life.

It is to be noted that Samples 4 and 15 whose quantum dot material had a particle size distribution having three peaks were regarded as tentatively acceptable, but Sample 4 could be more simply produced as compared to Sample 15.

TABLE 1

| | | Structure | | | | | | | | |
|---|---|---|---|---|---|---|---|---|---|---|
| | | Quantum Dot Material | | | | | | | | |
| | | | | Particle Size Distribution | | | | | | |
| Sample No. | Light-Emitting Material | Core | Shell | Median (nm) | d10 (nm) | d90 (nm) | d90 − d10 (nm) | Half-Width t (nm) | Shape of Particle Size Distribution | Surface Modification |
| 1 | QDs | CdSe | — | 3.5 | 2.0 | 5.0 | 3.0 | 1.5 | c | None |
| 2 | QDs | CdSe | ZnO | 4.0 | 2.0 | 6.0 | 4.0 | 2.0 | c | None |
| 3 | QDs | CdSe | ZnO | 4.0 | 2.0 | 6.0 | 4.0 | 2.0 | c | Modified |
| 4 | QDs | CdSe | ZnO | 2/3.5/5 | 2.0 | 6.0 | 4.0 | — | d | None |
| 5 | QDs | CdSe | ZnO | 4.0 | 2.0 | 7.0 | 5.0 | 3.0 | a | Modified |
| 6 | QDs | CdSe | ZnO | 4.0 | 2.0 | 7.0 | 5.0 | 4.0 | a | Modified |
| 7 | QDs | CdSe | ZnO | 4.5 | 2.0 | 7.0 | 5.0 | 2.5 | b | None |
| 8 | QDs | CdSe | ZnO | 4.5 | 2.0 | 7.0 | 5.0 | 2.5 | b | Modified |
| 9 | QDs | CdSSe | ZnS | 4.0 | 2.0 | 6.0 | 4.0 | 2.0 | c | None |
| 10 | QDs | CdSSe | ZnS | 4.0 | 2.0 | 6.0 | 4.0 | 2.0 | c | Modified |
| 11 | QDs | CdSSe | ZnS | 4.5 | 2.0 | 7.0 | 5.0 | 2.5 | b | None |
| 12 | QDs | CdSSe | ZnS | 4.5 | 2.0 | 7.0 | 5.0 | 2.5 | b | Modified |
| 13 | P + QDs | CdSe | ZnO | 4.5 | 3.5 | 5.5 | 2.0 | 1.0 | e | None |
| 14 | QDs | CdSe | ZnO | 3.0 | 1.5 | 3.5 | 2.0 | 1.0 | e | None |
| 15 | QDs/QDs/QDs | CdSe | ZnO | 2/3.5/5 | 2.0 | 6.0 | 4.0 | — | d | None |
| 16 | P + P + P | — | — | — | — | — | — | — | — | — |

| | Evaluation Items | | | | |
|---|---|---|---|---|---|
| Sample No. | Color Rendering Properties Ra | Service Life | Luminous Efficacy | Number of times light-emitting layer is applied | Remarks |
| 1 | 3 | 3 | 3 | 1 | Example |
| 2 | 3 | 4 | 3 | 1 | Example |
| 3 | 3 | 4 | 4 | 1 | Example |
| 4 | 2 | 3 | 3 | 1 | Example |
| 5 | 4 | 5 | 4 | 1 | Example |
| 6 | 5 | 5 | 4 | 1 | Example |
| 7 | 4 | 4 | 3 | 1 | Example |
| 8 | 4 | 4 | 4 | 1 | Example |
| 9 | 3 | 4 | 3 | 1 | Example |
| 10 | 3 | 5 | 4 | 1 | Example |
| 11 | 4 | 4 | 3 | 1 | Example |
| 12 | 4 | 5 | 4 | 1 | Example |
| 13 | 2 | 2 | 3 | 1 | Comparative Example |
| 14 | 1 | — | 3 | 1 | Comparative Example |
| 15 | 2 | 3 | 3 | 3 | Example |
| 16 | 2 | 1 | 4 | 1 | Reference Example |

On the other hand, Sample 13 containing a phosphorescence-emitting material as a light-emitting material was regarded as rejectable not only in "Evaluation of Service Life as White Light-Emitting Element" but also in "Evaluation of Color Rendering Properties".

Sample 14 had a d90−d10 of 2.0 nm, and was therefore regarded as rejectable in "Evaluation of Color Rendering Properties". Further, Sample 14 emitted light of a single color (blue), and was therefore the result of "Evaluation of Service Life as White Light-Emitting Element" was expressed as "-" (no result).

REFERENCE SIGNS LIST

1 Substrate
2 First electrode (Positive electrode)
5 Light-emitting layer
7 Second electrode (Negative electrode)
11 Quantum dot material
20 Functional layer
100 Electroluminescence element

The invention claimed is:

1. An electroluminescence element comprising:
a substrate;
a first electrode;
a functional layer including at least one light-emitting layer; and
a second electrode, wherein
the at least one light-emitting layer contains a quantum dot material, and
when a particle size at a cumulative frequency of 10% and a particle size at a cumulative frequency of 90% in a volume-based cumulative particle size distribution of the quantum dot material are defined as d10 (nm) and d90 (nm), respectively, the quantum dot material satisfies d90−d10≥3 nm.

2. The electroluminescence element according to claim 1, wherein the quantum dot material satisfies d90−d10≥5 nm.

3. The electroluminescence element according to claim 2, wherein when a half width of a maximum peak in the volume-based particle size distribution is defined as t (nm), the quantum dot material satisfies t/(d90−d10)>0.5.

4. The electroluminescence element according to claim 2, wherein the quantum dot material comprises a core and a shell surrounding the core.

5. The electroluminescence element according to claim 2, wherein the quantum dot material is surface-modified with a surface modifier.

6. The electroluminescence element according to claim 1, wherein when a half width of a maximum peak in the volume-based particle size distribution is defined as t (nm), the quantum dot material satisfies t/(d90−d10)>0.5.

7. The electroluminescence element according to claim 6, wherein the quantum dot material comprises a core and a shell surrounding the core.

8. The electroluminescence element according to claim 6, wherein the quantum dot material is surface-modified with a surface modifier.

9. The electroluminescence element according to claim 1, wherein the quantum dot material comprises a core and a shell surrounding the core.

10. The electroluminescence element according to claim 9, wherein the quantum dot material is surface-modified with a surface modifier.

11. The electroluminescence element according to claim 1, wherein the quantum dot material is surface-modified with a surface modifier.

* * * * *